(12) United States Patent
Sunaga et al.

(10) Patent No.: US 12,355,110 B2
(45) Date of Patent: Jul. 8, 2025

(54) CONNECTION STRUCTURE BETWEEN FLEXIBLE SUBSTRATE AND BUS BAR, WIRING MODULE AND ELECTRICITY STORAGE MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Takahiro Sunaga, Mie (JP); Hiroomi Hiramitsu, Mie (JP); Yuto Sato, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 865 days.

(21) Appl. No.: 17/621,102

(22) PCT Filed: Jun. 12, 2020

(86) PCT No.: PCT/JP2020/023220
§ 371 (c)(1),
(2) Date: Dec. 20, 2021

(87) PCT Pub. No.: WO2020/255878
PCT Pub. Date: Dec. 24, 2020

(65) Prior Publication Data
US 2022/0344783 A1  Oct. 27, 2022

(30) Foreign Application Priority Data
Jun. 21, 2019  (JP) .................... 2019-115250

(51) Int. Cl.
*H01M 50/519*  (2021.01)
*H01M 50/209*  (2021.01)
(Continued)

(52) U.S. Cl.
CPC ....... *H01M 50/519* (2021.01); *H01M 50/209* (2021.01); *H01M 50/284* (2021.01);
(Continued)

(58) Field of Classification Search
CPC ............. H01M 50/284; H01M 50/505; H01M 50/507; H01M 2220/20; H05K 1/14
See application file for complete search history.

(56) References Cited

U.S. PATENT DOCUMENTS

| 8,777,668 B2 | 7/2014 | Ikeda et al. |
| 10,297,937 B2 | 5/2019 | Hirasawa et al. |
| 2012/0231638 A1 | 9/2012 | Ikeda et al. |

FOREIGN PATENT DOCUMENTS

| JP | 51-134344 | 11/1976 |
| JP | 02-256158 | 10/1990 |

(Continued)

OTHER PUBLICATIONS

English Machine Translation of JP 201226969A (Year: 2012).*
(Continued)

*Primary Examiner* — Kourtney R S Carlson
(74) *Attorney, Agent, or Firm* — GREENBLUM & BERNSTEIN, P.L.C.

(57) ABSTRACT

A connection structure between a flexible substrate and a bus bar includes: a flexible substrate; a plurality of bus bars; and a connection piece, in which the flexible substrate is formed by being covered by a plurality of conductive paths containing a first metal, and a resin base material, the bus bars are formed so as to contain a second metal, the conductive paths include a second conductive path extending from a
(Continued)

first conductive path, the resin base material includes a sub-film portion that is branched from a main film portion and extends over the bus bars, the second conductive path is disposed on the sub-film portion, the connection piece is formed so as to contain a third metal that has a higher joining strength of welding to the first metal and the second metal than a joining strength of welding between the first metal and the second metal.

12 Claims, 15 Drawing Sheets

(51) Int. Cl.
  *H01M 50/284* (2021.01)
  *H01M 50/503* (2021.01)
  *H01M 50/507* (2021.01)
  *H01M 50/516* (2021.01)
  *H01M 50/522* (2021.01)

(52) U.S. Cl.
  CPC ....... *H01M 50/503* (2021.01); *H01M 50/507* (2021.01); *H01M 50/516* (2021.01); *H01M 50/522* (2021.01); *H01M 2220/20* (2013.01)

(56) References Cited

FOREIGN PATENT DOCUMENTS

| | | |
|---|---|---|
| JP | 2011-228216 | 11/2011 |
| JP | 2012-190678 | 10/2012 |
| JP | 2012-226969 | 11/2012 |
| JP | 2019-029534 | 2/2019 |

OTHER PUBLICATIONS

International Search Report issued in International Bureau of WIPO Patent Application No. PCT/JP2020/023220, dated Aug. 18, 2020, along with an English translation thereof.

* cited by examiner

CONNECTION STRUCTURE BETWEEN FLEXIBLE SUBSTRATE AND BUS BAR, WIRING MODULE AND ELECTRICITY STORAGE MODULE

TECHNICAL FIELD

The present disclosure relates to a connection structure between a flexible substrate and a bus bar, a wiring module, and an electricity storage module.

BACKGROUND ART

For example, as a composite flexible printed wiring board formed by joining a plurality of flexible printed wiring boards, the one described in JP 2019-29534A (Patent Document 1 below) is known.

Each flexible printed wiring board includes a metal block that is made of copper and is connected to a conductor layer. The plurality of flexible printed wiring boards are joined by laser welding or resistance welding the metal blocks together.

CITATION LIST

Patent Document

Patent Document 1: JP 2019-29534A

SUMMARY OF INVENTION

Technical Problem

Aluminum or an aluminum alloy has been studied as a metal for a bus bar. However, in general, when a connection portion that contains copper and is provided on a flexible printed wiring board is joined to a bus bar containing aluminum through welding, an intermetallic compound composed of the metal of a land and the metal of the bus bar is produced in a joined portion where the connection portion and the bus bar are joined through welding. When an intermetallic compound is produced in the joined portion, the joined portion becomes brittle, resulting in a reduction in the joining strength between the flexible printed wiring board and the bus bar.

For this reason, a method is conceivable in which, as shown in FIG. 15, a relay member 503 containing nickel or the like that has high joining strength to a land of a flexible printed wiring board 501 and a bus bar 502 is disposed so as to bridge between the flexible printed wiring board 501 and the bus bar 502, then the land and the relay member 503 are joined using solder or the like, and the bus bar 502 and the relay member 503 are joined through welding. This makes it possible to electrically connect the flexible printed wiring board 501 to the bus bar 502, while improving the joining strength of the joined portion of the flexible printed wiring board 501 and the bus bar 502 to the relay member 503.

However, with the above-described method, the relay member is inclined between the flexible printed wiring board and the bus bar when the flexible printed wiring board and the bus bar have different thicknesses. For this reason, it is necessary to align the flexible printed wiring board and the bus bar with the relay member. Even if this alignment is performed in advance, when the thicknesses of the flexible printed wiring board and the bus bar vary due to manufacturing tolerances or the like, the relay member is joined while being inclined, resulting in a reduced joining strength.

The present specification discloses a technique for electrically connecting two members, while improving the joining strength of the joined portion.

Solution to Problem

A connection structure between a flexible substrate and a bus bar according to the present disclosure includes: a flexible substrate, at least one bus bar, and at least one connection piece, wherein the flexible substrate is formed by a plurality of conductive paths being covered by a flexible resin base material having an insulating property, the conductive paths each containing a first metal, the bus bar contains a second metal different from the first metal and is formed in a plate shape, the conductive paths include a first conductive path, and a second conductive path extending from the first conductive path, the resin base material includes a band-shaped main base material, and a sub-base material that is branched from the main base material and extends over the bus bar, at least one said first conductive path is disposed on the main base material, at least one said second conductive path is disposed on the sub-base material, the second conductive path includes a connection land exposed from the sub-base material, the connection piece contains a third metal that is different from the first metal and the second metal, and that has a higher joining strength of welding to the second metal than a joining strength of welding between the first metal and the second metal, the connection piece being formed in a plate shape, and the bus bar is joined to the connection piece through welding, and the connection land is joined to the connection piece through brazing and soldering.

Advantageous Effects of Invention

According to the present disclosure, it is possible to electrically connect two members, while improving the joining strength of the joined portion.

DESCRIPTION OF EMBODIMENTS

Figure 1:
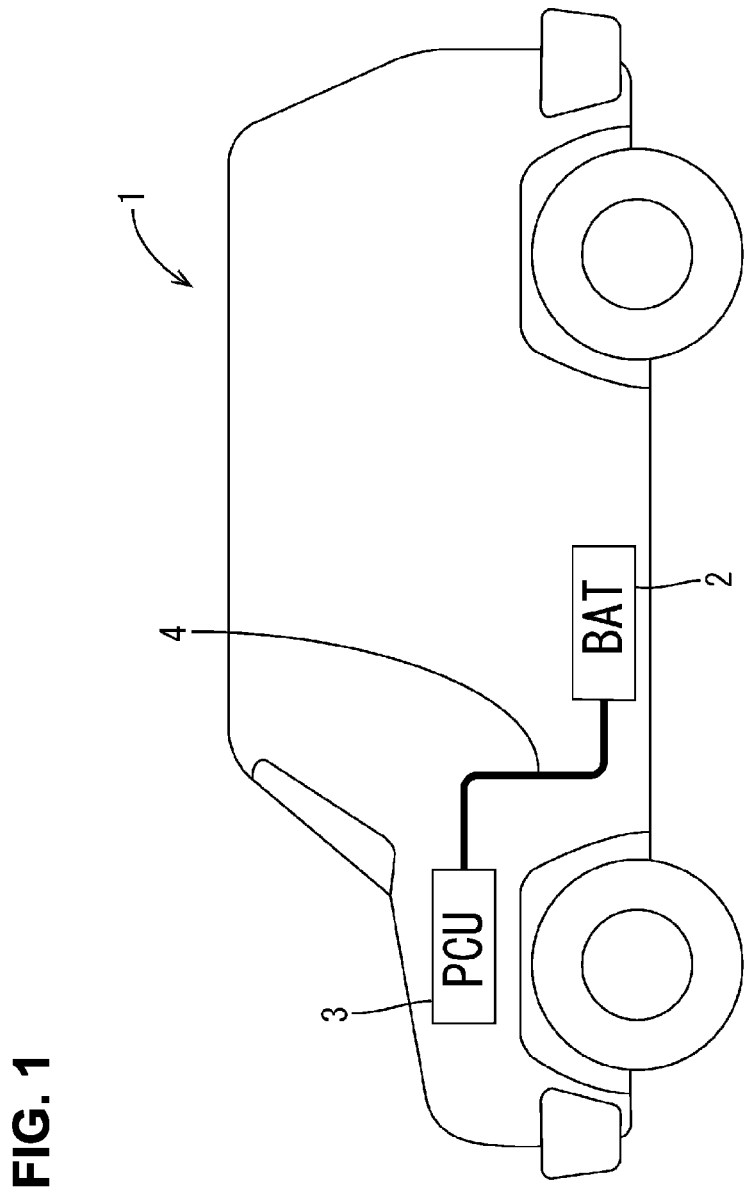
FIG. 1 is a schematic diagram showing a vehicle in which an electricity storage module according to Embodiment 1 is mounted.

Description of Embodiments of the Present Disclosure

First, embodiments of the present disclosure will be listed and described.

(1) A connection structure between a flexible substrate and a bus bar includes: a flexible substrate, at least one bus bar, and at least one connection piece, wherein the flexible substrate is formed by a plurality of conductive paths being covered by a flexible resin base material having an insulating property, the conductive paths each containing a first metal, the bus bar contains a second metal different from the first metal and is formed in a plate shape, the conductive paths include a first conductive path, and a second conductive path extending from the first conductive path, the resin base material includes a band-shaped main base material, and a sub-base material that is branched from the main base material and extends over the bus bar, at least one said first conductive path is disposed on the main base material, at least one said second conductive path is disposed on the sub-base material, the second conductive path includes a connection land exposed from the sub-base material, the connection piece contains a third metal that is different from the first metal and the second metal, and that has a higher joining strength of welding to the second metal than a joining strength of welding between the first metal and the second metal, the connection piece being formed in a plate shape, and the bus bar is joined to the connection piece through welding, and the connection land is joined to the connection piece through brazing and soldering.

The connection land exposed on the sub-base material of the flexible substrate extends over the bus bar, and the connection land and the bus bar are joined via the connection piece formed so as to contain the third metal that has a higher joining strength of welding to the second metal than a joining strength of welding between the first metal and the second metal. That is, it is possible to electrically connect the flexible substrate and the bus bar, while improving the joining strength of welding between the bus bar and the connection piece. Here, welding as used herein refers to melting at least one of two base metals to integrate the two base metals with each other so as to be continuous, and is joining means different from brazing and soldering. Specific examples of welding means include laser welding, resistance welding, and ultrasonic welding.

Also, in the case where the flexible substrate and the bus bar have different thicknesses, the second conductive path can be routed between the flexible substrate and the bus bar as a result of the sub-base material being flexed. This makes it possible to connect the connection land and the bus bar without the need to align the flexible substrate with the bus bar in advance. That is, unlike the case where a flexible substrate and a bus bar are connected by a relay member bridging between the flexible substrate and the bus bar, the connection piece will not be inclined between the connection land and the bus bar. Accordingly, it is possible to prevent a reduction in the joining strength between the connection piece, and the connection land and the bus bar.

Since the connection land disposed on the bus bar and the bus bar are connected via the connection piece, the size of the connection piece can be reduced as compared with the case where the relay member bridges between the flexible substrate and the bus bar, for example. This makes it possible to reduce the manufacturing costs.

(2) The connection piece includes a land connection portion and a bus bar connection portion, the third metal is a metal whose surface is less susceptible to formation of an oxide film than a surface of the second metal is, the land connection portion is joined to the connection land through brazing and soldering, and the bus bar connection portion is joined to the bus bar through welding. Here, brazing and soldering refers to melting a filler metal such as a brazing material or solder to integrate two base metals so as to be continuous without melting the base metals, and examples thereof include brazing, and soldering.

For example, by forming the connection piece using the same metal as that of the bus bar in order to increase the joining strength to the bus bar, it is possible to increase the joining strength of welding between the bus bar and the bus bar connection portion. However, when the surface of the connection piece is susceptible to formation of an oxide film, joining through brazing and soldering results in a reduced joining strength between the land connection portion and the connection land unless a treatment to remove the oxide film is performed.

However, since the connection piece is formed so as to contain the third metal that is less susceptible to formation of an oxide film than the bus bar is, the joining strength of brazing and soldering between the land connection portion and the connection land can be increased without the need to perform a treatment to remove the oxide film.

The land connection portion of the connection piece is joined in advance to the connection land of the flexible substrate using solder, and thereafter the bus bar connection portion and the bus bar can be joined through welding. Accordingly, it is possible to separately perform joining of the connection piece and the connection land, and joining of the connection piece and the bus bar, without the need to align the two members with the connection piece.

That is, as compared with, for example, the case where the connection piece is joined to the two members at the same time, positional misalignment of the connection piece relative to the connection land and the bus bar can be suppressed, thus making it possible to suppress a reduction in the joining strength of the joined portion due to positional misalignment.

(3) The first metal is copper, the second metal is aluminum, and the third metal is nickel.

(4) The first metal is aluminum, the second metal is copper, and the third metal is nickel.

In general, copper or a copper alloy is used for conductive paths and bus bars of a flexible substrate such as a flexible printed circuit and a flexible flat cable. In recent years, aluminum or an aluminum alloy has been studied as a metal used for conductive paths and bus bars of a flexible printed circuit and a flexible flat cable.

Therefore, as a result of intensive studies, the present inventors have gained the knowledge that the joining strength between nickel and copper and the joining strength between nickel and aluminum are higher than the joining strength between copper and aluminum.

That is, since the connection piece is formed so as to contain nickel, it is possible to improve the joining strength of joining through brazing and soldering between the connection land and the land connection portion, and to improve the joining strength of joining through welding between the bus bar and the bus bar connection portion.

(5) The connection land is formed so as to be exposed on a surface of the sub-base material that is on the bus bar side, the land connection portion is disposed between the connection land and the bus bar, and the bus bar connection portion is disposed so as to be exposed from the sub-base material.

The bus bar connection portion can be welded to the bus bar using the portion exposed from the sub-base material as a marker. Accordingly, it is possible to suppress positional misalignment of the welded position on the bus bar connection portion relative to the bus bar. This makes it possible to suppress a reduction in the joining strength between the bus bar connection portion and the bus bar due to positional misalignment of the joined portion.

For example, when the connection land is formed so as to be exposed on a surface of the sub-base material that is opposite to the bus bar side, the position of the connection land and the position of the bus bar are misaligned in the thickness direction of the flexible substrate. Accordingly, it is necessary to machine the connection piece in order to align the land connection portion with the bus bar connection portion.

However, with the above-described configuration, the position of the land connection portion and the position of the bus bar connection portion will not be misaligned in the thickness direction of the flexible substrate. Accordingly, it is possible to electrically connect the flexible substrate and the bus bar, without machining the connection piece.

(6) The main base material includes a bent portion that is bent toward the sub-base material, and that is continuous with the sub-base material.

In the case of forming the bent portion, a part of the main base material is bent to form the sub-base material. Accordingly, it is possible to improve the yield of the flexible substrate as compared with the case of forming a flexible substrate in which the sub-base material originally protrudes from the main base material.

(7) An electronic component that is connected to the first conductive path using solder is attached on a surface of the main base material that is opposite to the bus bar side, and the bent portion is bent so as to invert the connection land.

In the case of forming the bent portion by inverting the connection land, the connection land is exposed on the surface where the electronic component is disposed (the surface opposite to the bus bar side), in the state before the bent portion is formed. Accordingly, before forming the bent portion, the connection piece and the electronic component are collectively connected to the flexible substrate by passing the flexible substrate through a reflow furnace, with the connection piece disposed on the connection land, and the electronic component disposed on the first conductive path. Then, the connection piece is disposed between the connection land and the bus bar by forming the bent portion.

That is, it is possible to collectively join the connection piece and the electronic component using solder. Accordingly, as compared with, for example, the case where the connection piece and the electronic component are separately joined using solder, it is possible to reduce the number of man-hours, thus making it possible to reduce the manufacturing costs.

(8) The connection land is formed so as to be exposed on a surface of the sub-base material that is on the bus bar side, a surface of the bus bar connection portion that is opposite to the bus bar is recessed, and a surface of the bus bar connection portion that is on the bus bar side protrudes toward the bus bar.

The bus bar connection portion can be welded to the bus bar using the recessed portion as a marker. Accordingly, it is possible to suppress positional misalignment of the joined position on the bus bar connection portion relative to the bus bar. This can suppress a reduction in the joining strength between the bus bar connection portion and the bus bar due to positional misalignment of the joined portion.

(9) The sub-base material has a base material through hole extending therethrough in a plate thickness direction, the connection land has a land through hole extending therethrough in a plate thickness direction, the land through hole being disposed coaxially with the base material through hole, and the bus bar connection portion is exposed through the base material through hole and the land through hole.

The bus bar connection portion can be welded to the bus bar using, as a marker, the portion exposed from the base material through hole and the land through hole. Accordingly, it is possible to suppress positional misalignment of the joined position on the bus bar connection portion relative to the bus bar. This can suppress a reduction in the joining strength between the bus bar connection portion and the bus bar due to positional misalignment of the joined portion.

(10) A wiring module includes: the above-described connection structure between the flexible substrate and the bus bar; and an insulating protector that is attached to an electricity storage element group in which a plurality of electricity storage elements including electrode terminals are arranged side by side, in a state in which the insulating protector holds at least one said flexible substrate and a plurality of the bus bars, and the bus bars are joined to the electrode terminals through welding.

(11) The wiring module is a vehicle wiring module that is to be used while mounted in a vehicle.

(12) An electricity storage module includes the above-described wiring module and the above-described electricity storage element group.

DETAILS OF EMBODIMENTS OF THE PRESENT DISCLOSURE

Specific examples of a connection structure between a flexible substrate and a bus bar, a wiring module, and electricity storage module according to the present disclosure will be described with reference to the drawings below. It should be noted that the present disclosure is not limited to these examples, but is defined by the claims, and is intended to include all modifications which fall within the scope of the claims and the meaning and scope of equivalents thereof.

Embodiment 1

Embodiment 1, in which the present disclosure is applied to an electricity storage pack 2 that is mounted in a vehicle 1, will be described with reference to FIGS. 1 to 7. The electricity storage pack 2 is mounted in the vehicle 1 such as an electric automobile or a hybrid automobile, and is used as a driving source of the vehicle 1. In the following description, for a plurality of identical members, reference numerals may be assigned to some of the members, and reference numerals may be omitted for the other members.

Overall Configuration

As shown in FIG. 1, the electricity storage pack 2 is disposed in the vicinity of the center of the vehicle 1. A PCU 3 (Power Control Unit) is disposed at a front portion of the vehicle 1. The electricity storage pack 2 and the PCU 3 are connected by a wire harness 4. The electricity storage pack 2 and the wire harness 4 are connected by a connector, which is not shown. The electricity storage pack 2 includes an electricity storage module 10 including a plurality of electricity storage elements 71.

Electricity Storage Module 10

Figure 2:
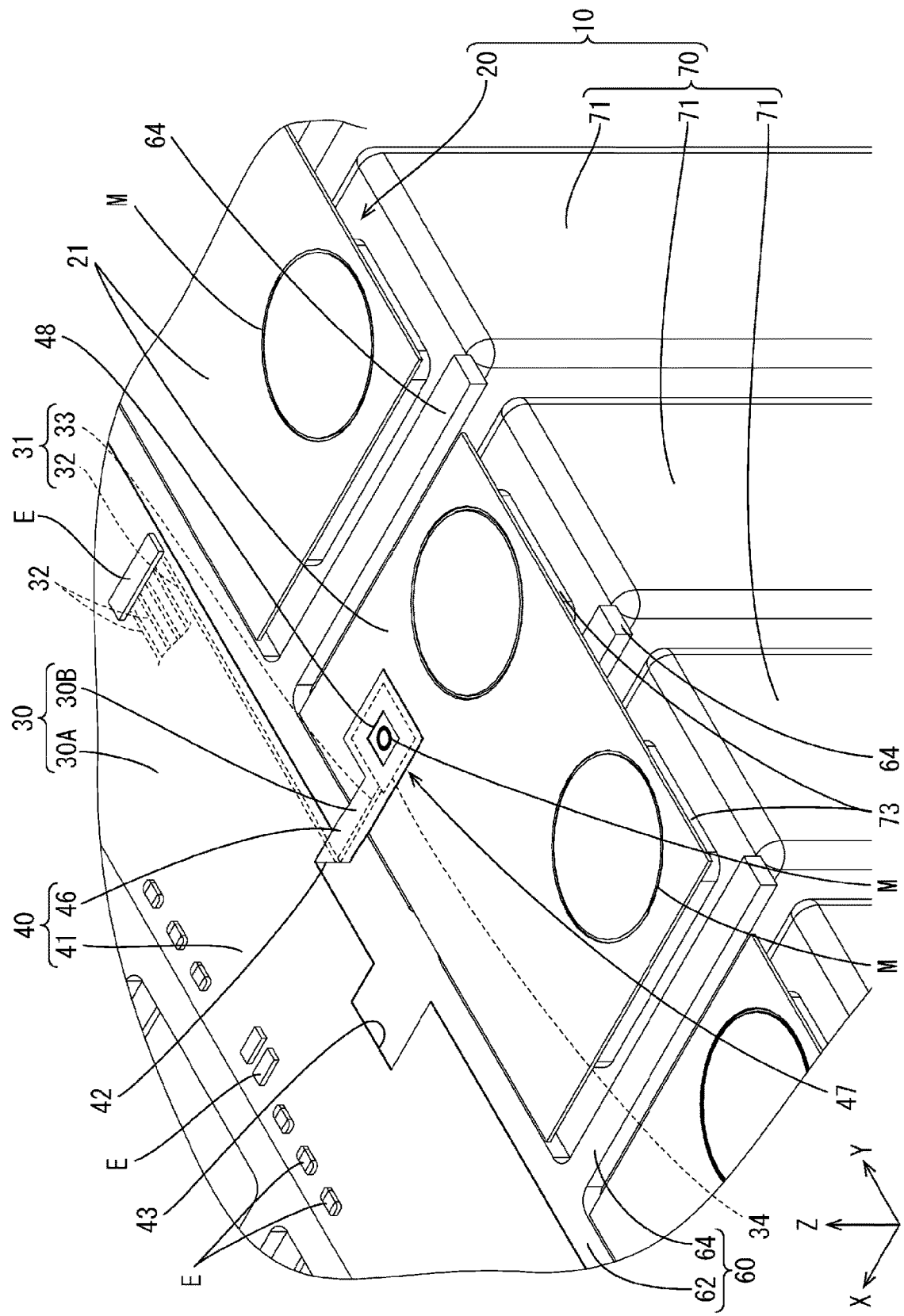
FIG. 2 is a partial perspective view of the electricity storage module according to Embodiment 1.
Figure 3:
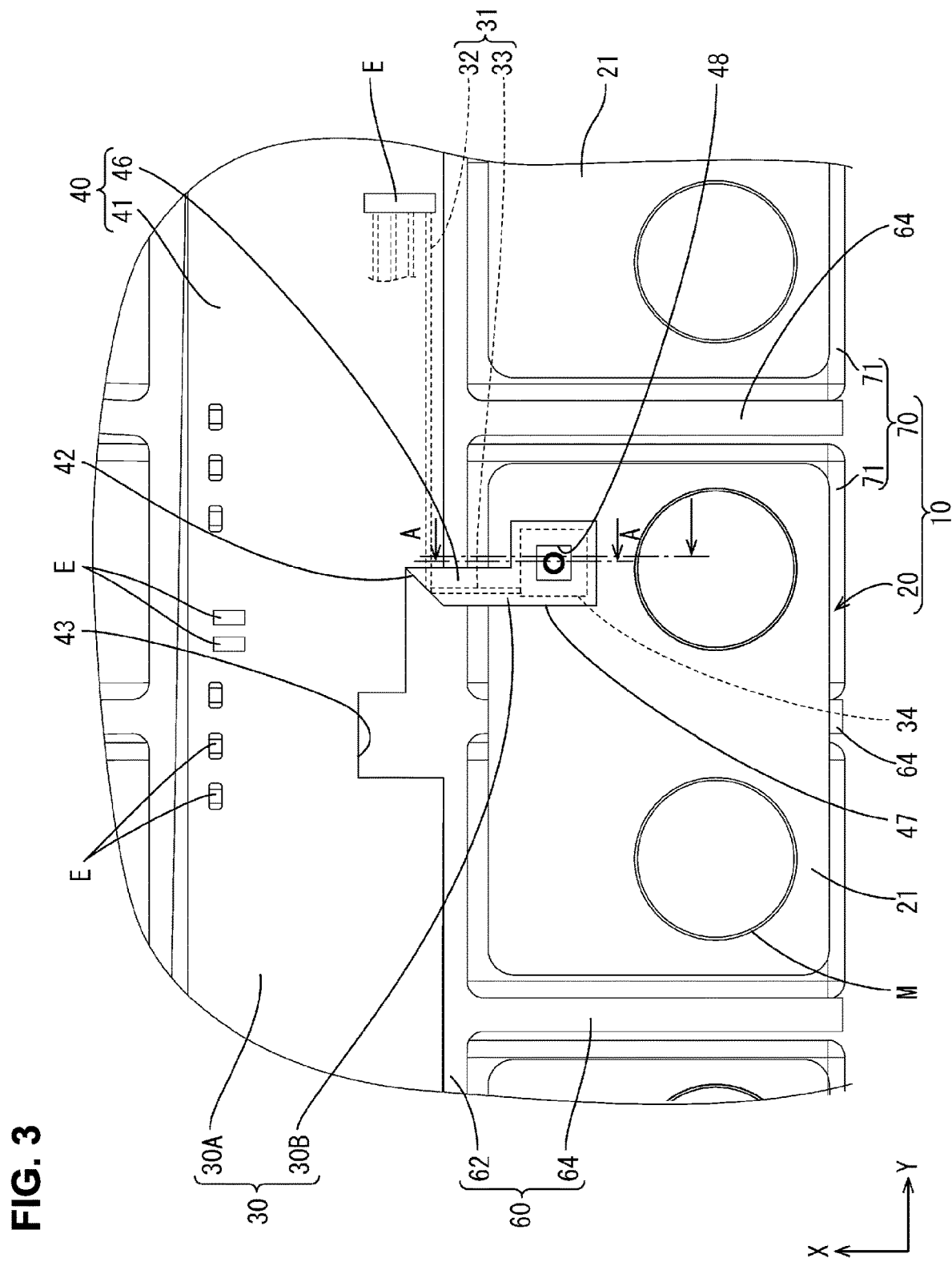
FIG. 3 is a partial plan view of the electricity storage module.

As shown in FIGS. 2 and 3, the electricity storage module 10 includes an electricity storage element group 70 and a wiring module 20. FIGS. 2 and 3 show a part of the electricity storage module 10.

Electricity Storage Element Group 70

As shown in FIGS. 2 and 3, the electricity storage element group 70 includes a plurality of electricity storage elements 71 arranged side by side in the front-rear direction. Each of the electricity storage elements 71 is a secondary battery, for example. A pair of electrode terminals 73 are disposed on an upper surface of each of the electricity storage elements 71 at positions near opposite end portions in the left-right direction. The illustration of the right electrode of each of the electrode terminals 73 is omitted. Two electricity storage elements 71 adjacent to each other in the front-rear direction are disposed such that the adjacent electrode terminals 73 have different polarities. The electrode terminals 73 are formed flat such that a bus bar 21 of the wiring module 20, which will be described later, can be placed thereon.

Wiring Module 20

The wiring module 20 is configured to be attached to the electricity storage element group 70 from above, and includes bus bars 21, a flexible printed circuit (an example of a "flexible substrate") 30, a connection piece 50 that connects each bus bar 21 and the flexible printed circuit 30, and an insulating protector 60.

Bus Bar 21

As shown in FIG. 3, each bus bar 21 is formed in a flat plate shape that is rectangular in a plan view by machining a conductive metal plate material. The bus bar 21 is formed, for example, by machining an aluminum-containing metal plate material such as an aluminum plate or an aluminum alloy plate. The bus bar 21 is sized to cover the electrode terminals 73 that are adjacent to each other in the front-rear direction in the electricity storage element group 70.

When the wiring module 20 is attached to the electricity storage element group 70, the bus bar 21 is placed on the electrode terminals 73 adjacent in the front-rear direction so as to extend over the electrode terminals 73. As shown in FIGS. 2 and 3, the bus bar 21 placed on the electrode terminals 73 is joined circularly to the electrode terminals 73 through laser welding. Consequently, circular welding marks M are formed on the bus bar 21. In addition, the bus bar 21 and the electrode terminals 73 are electrically connected and fixed to each other. Note that the laser welding may be performed linearly, rather than circularly. At each of the portions where the welding marks M are formed (the portions welded through laser welding), the bus bar 21, which is at least one of the base metals, i.e., the bus bar 21 and the electrode terminal 73, is melted to integrate the bus bar 21 and the electrode terminal 73 with each other so as to be continuous.

Flexible Printed Circuit 30

The flexible printed circuit (hereinafter also simply referred to as an "FPC") 30 is a member for electrically connecting the bus bars 21 to an electronic control unit, which is not shown, and transmitting, to the ECU, currents and temperatures, and voltages applied to the bus bars 21. The electronic control unit is a well-known electronic control unit equipped with a microcomputer, an electronic element, and the like, and has a function of, for example, detecting voltages, currents, temperatures, and the like of the electricity storage elements 71 that have been transmitted via the FPC 30, and controlling the charging/discharging of the electricity storage element group 70.

As shown in FIGS. 2 and 3, the FPC 30 includes a main substrate 30A extending over the entire length of the electricity storage element group 70 in the front-rear direction, which is the arrangement direction of the electricity storage elements 71, so as to extend along the front-rear direction, and a sub-substrate 30B protruding leftward from the main substrate 30A. In addition, the FPC 30 includes an insulating film (an example of a "resin base material") 40, a plurality of conductive paths 31, and an electronic component E.

Insulating Film 40

The insulating film 40 is made of a synthetic resin having flexibility and insulating properties, such as polyimide, and covers the conductive paths 31 from both surfaces thereof in the up-down direction. As shown in FIGS. 2 and 3, the insulating film 40 includes a main film portion (an example of a "main base material") 41, and a sub-film portion (an example of a "sub-base material") 46.

Main Film Portion 41

As shown in FIG. 2, the main film portion 41 is formed extending in a band shape over the entire length of the electricity storage element group 70 along the front-rear direction, which is the arrangement direction of the electricity storage elements 71. The main film portion 41 constitutes a main substrate 30A, together with a first conductive path 32 of the plurality of conductive paths 31 described below.

The electronic component E is mounted on the main film portion 41. Specifically, although not shown, the electronic component E is electrically connected to the first conductive path 32 of the conductive paths 31 described below by being joined thereto using solder. As the electronic component E, any electronic component, including, for example, a resistor, a capacitor, a transistor, and a microcomputer, can be selected as appropriate.

A cut is made in a left end portion of the main film portion 41, and the portion in which the cut has been made is bent leftward to form a sub-film portion 46 protruding leftward from the main film portion 41.

The portion of the main film portion 41 that has been bent serves as a bent portion 42 that is bent leftward such that a portion that is to be formed as the sub-film portion 46 is vertically inverted. Accordingly, as shown in FIGS. 2 and 3, at the left end portion of the main film portion 41, a cut-out portion 43 having substantially the same size as that of the sub-film portion 46 is formed. The cut-out portion 43 is formed in an L shape in a plan view that extends in the front-rear direction and extends leftward, and the bent portion 42 is formed at a rear end portion of the cut-out portion 43.

Sub-Film Portion 46

Figure 4:
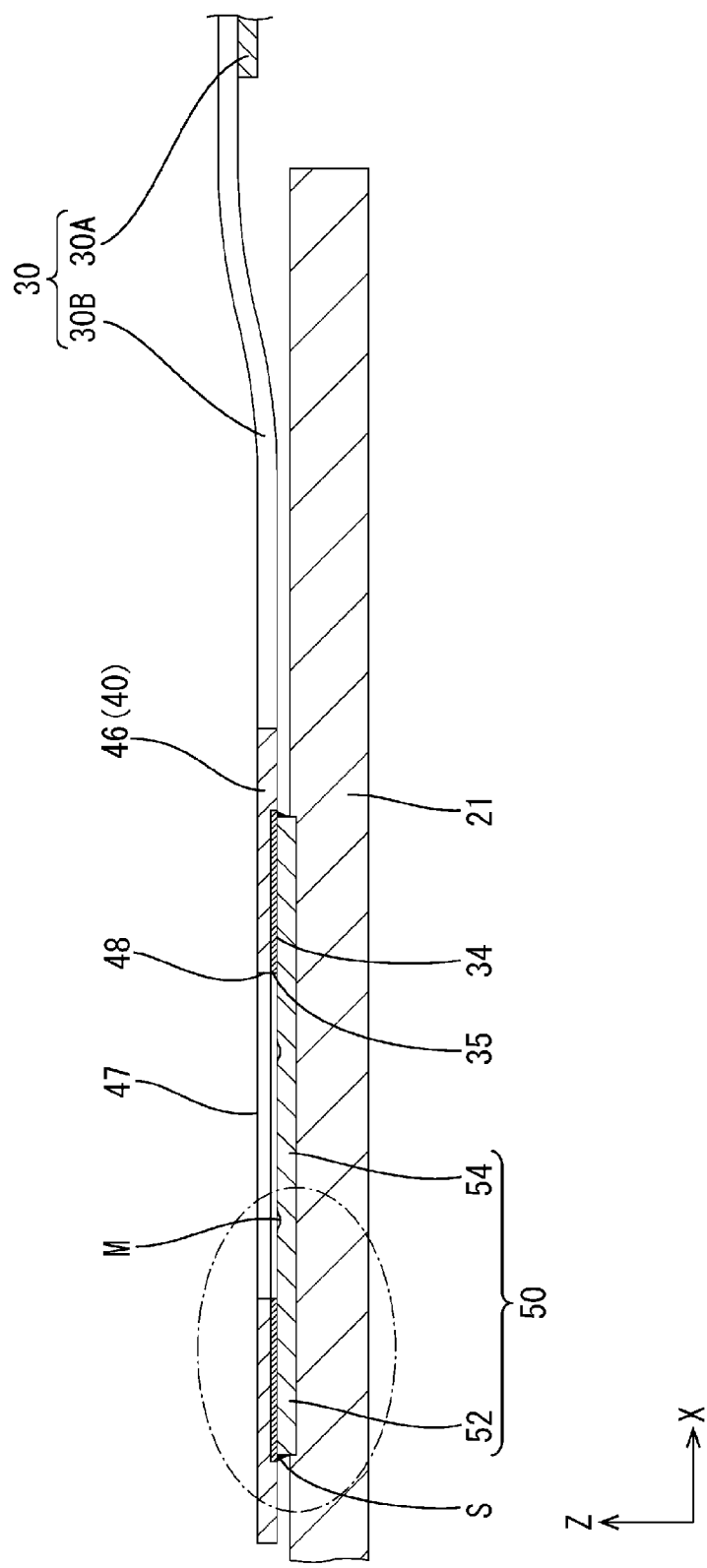
FIG. 4 is a cross-sectional view taken along the line A-A in FIG. 3.

As shown in FIGS. 2 and 3, the sub-film portion 46 is formed extending leftward from the bent portion 42 of the main film portion 41. The sub-film portion 46 constitutes a sub-substrate 30B, together with a second conductive path 33 of the conductive paths 31 described below. A left end portion of the sub-substrate 30B serves as a bus bar placement portion 47 formed in a square shape in a plan view. The sub-film portion 46 is disposed so as to bridge between the main substrate 30A and the bus bar 21. In other words, the sub-film portion 46 causes the second conductive path 33 to be routed from the main substrate 30A toward the bus bar 21 so as to bridge between the main substrate 30A and the bus bar 21. As shown in FIGS. 2 to 4, a rectangular base material through hole 48 extending through the sub-film portion 46 in the up-down direction, which is the plate thickness direction, is formed in a central portion of the bus bar placement portion 47.

Conductive Path 31

The plurality of conductive paths 31 are each made of a conductive metal foil. The metal foil is formed, for example, by a copper-containing metal foil such as a copper foil or a copper alloy foil. Each of the conductive paths 31 includes a first conductive path 32 and a second conductive path 33.

First Conductive Path 32

As shown in FIGS. 2 and 3, the first conductive path 32 is formed extending in the front-rear direction in the main film portion 41 of the main substrate 30A. A plurality of the first conductive paths 32 of the main substrate 30A are disposed side by side, spaced apart in the left-right direction. FIGS. 2 and 3 show only the first conductive path 32 disposed at a left end portion of the main substrate 30A, and the illustration of the other first conductive paths 32 except for a portion thereof is omitted.

Although not shown in detail, a part of each first conductive path 32 is exposed by removing a part of the main film portion 41 that is disposed above the first conductive path 32, and the electronic component E is joined to the exposed portion using solder.

Second Conductive Path 33

As shown in FIGS. 2 and 3, the second conductive path 33 is formed extending leftward from a front end portion of the first conductive path 32 so as to extend in the left-right direction in the sub-film portion 46 of the sub-substrate 30B. The second conductive path 33 is supported by the sub-film portion 46, and is thus routed between the main substrate 30A and the bus bar 21. A left end portion of the second conductive path 33 serves as a connection land 34.

Connection Land 34

As shown in FIGS. 2 to 5, the connection land 34 is disposed on the bus bar placement portion 47 of the sub-substrate 30B. The connection land 34 is formed by removing a part of the sub-film portion 46 that is disposed below the second conductive path 33 (the bus bar 21 side). Accordingly, the connection land 34 is exposed downward from the sub-film portion 46.

Figure 5:
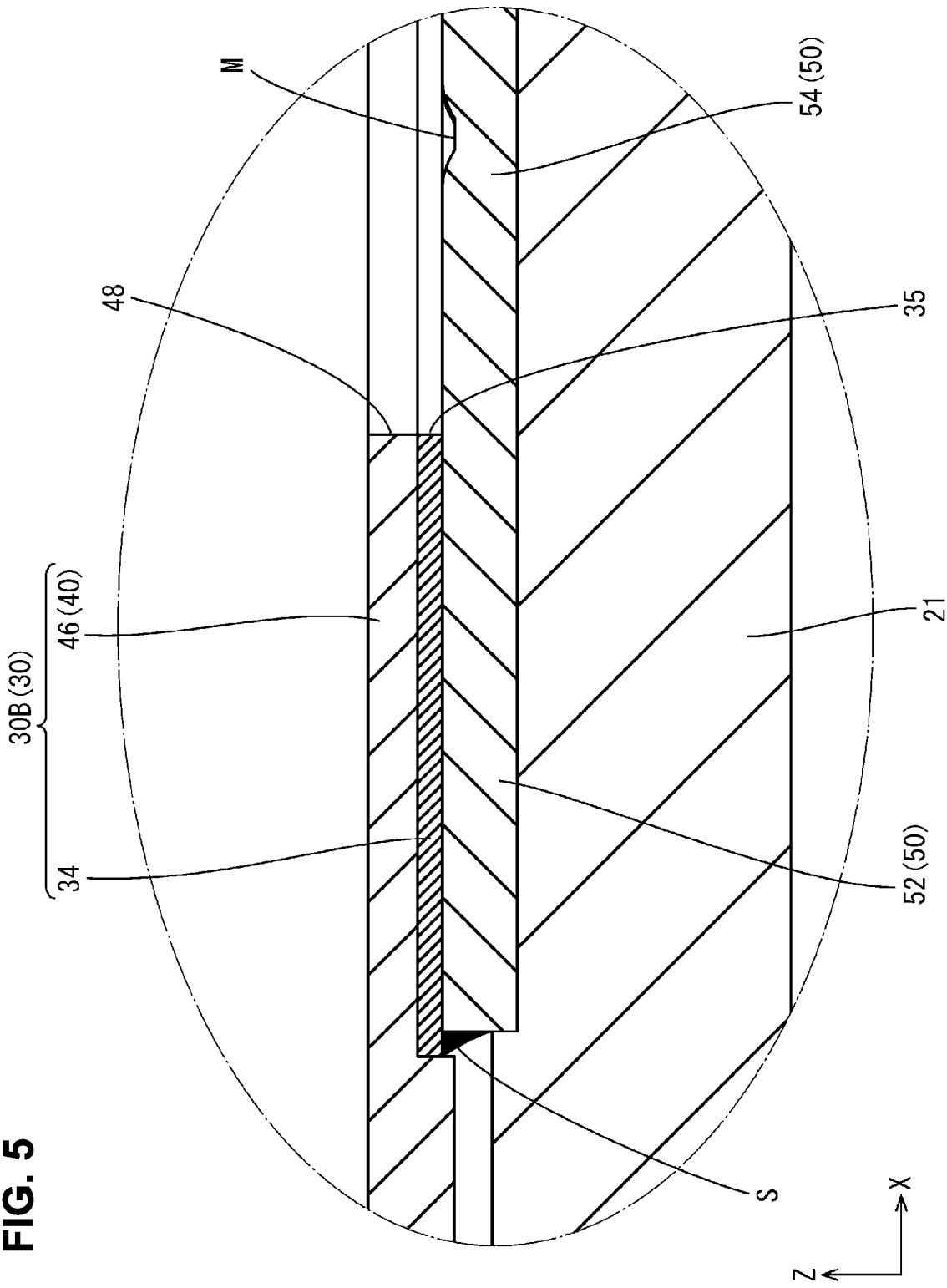
FIG. 5 is an enlarged cross-sectional view showing a principal part of FIG. 4.

The outer shape of the connection land 34 is formed in a square shape in a plan view that is slightly smaller than the bus bar placement portion 47. As shown in FIG. 4 and FIG. 5, at the center of the connection land 34, a land through hole 35 that has the same shape as the base material through hole 48 of the sub-film portion 46 and is disposed coaxially therewith is formed extending through the connection land 34 in the up-down direction so as to be in communication with the base material through hole 48. Accordingly, the connection land 34 is formed in the shape of a square frame in a plan view.

Connection Piece 50

As shown in FIGS. 4 and 5, the connection piece 50 electrically connects the connection land 34 to the bus bar 21 between the bus bar placement portion 47 of the sub-substrate 30B and the bus bar 21. In other words, the connection land 34 and the bus bar 21 are electrically connected via the connection piece 50.

Figure 6:
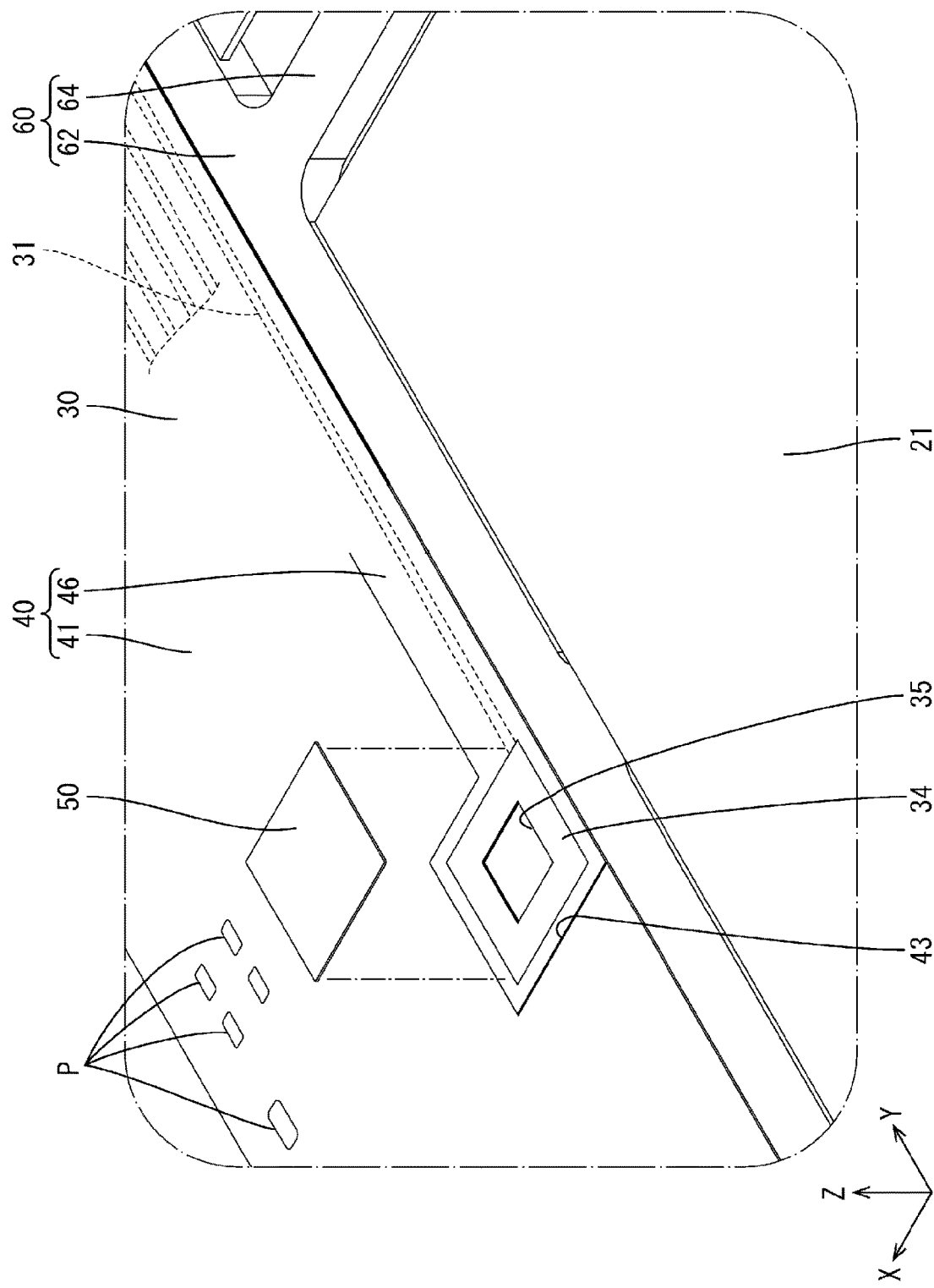
FIG. 6 is a partial perspective view of an assembly process of a wiring module, showing a state before a connection piece is placed on a connection land.
Figure 7:
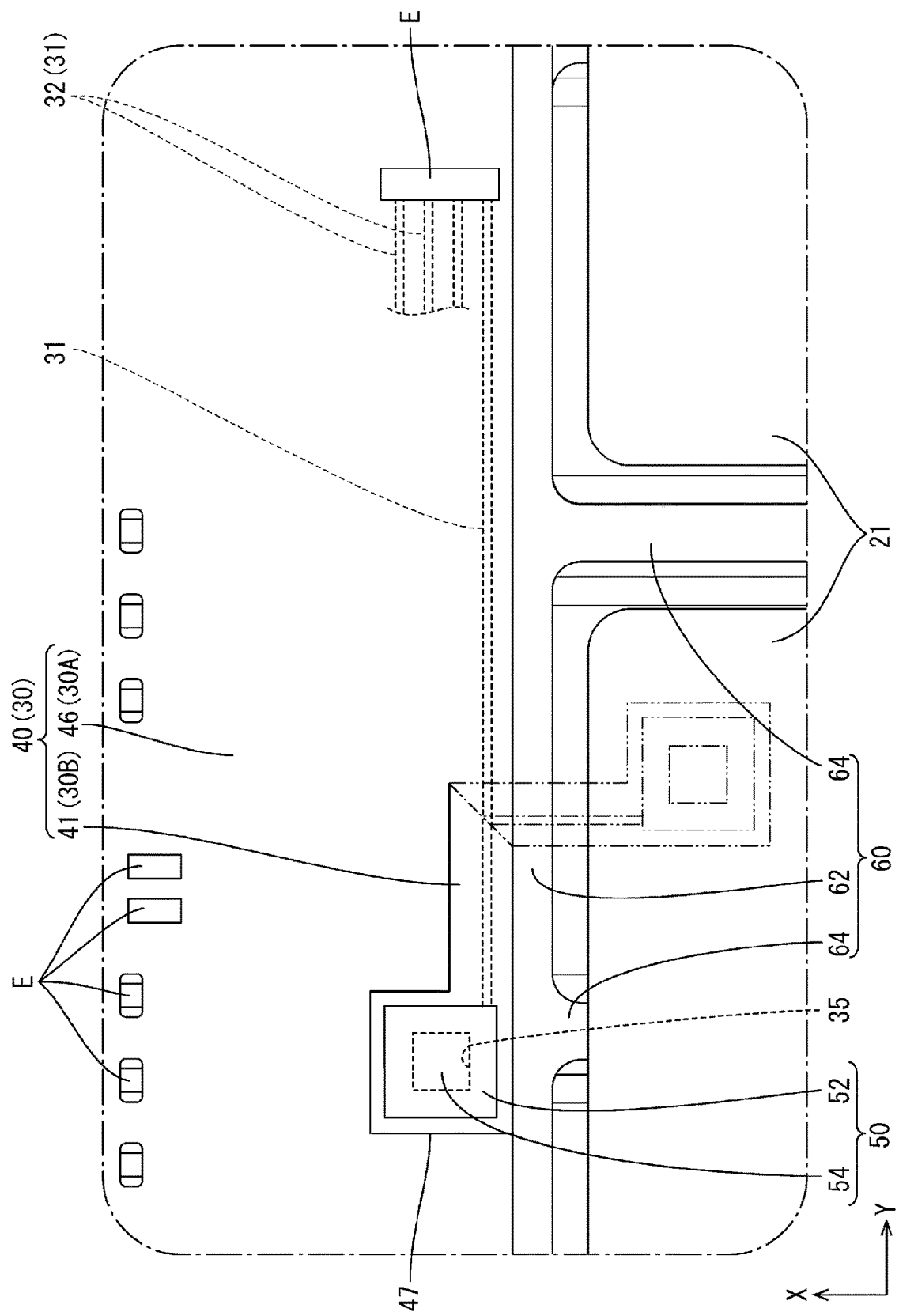
FIG. 7 is a partial perspective view of the assembly process of the wiring module, showing a state before a bent portion is bent.

As shown in FIGS. 6 and 7, the connection piece 50 is formed in the shape of a square flat plate in a plan view by machining a conductive metal plate material. The connection piece 50 is formed by machining a nickel-containing metal plate material, including, for example, a nickel plate, and a nickel alloy plate. The connection piece 50 is formed to have a size slightly smaller than that of the connection land 34 of the FPC 30. The connection piece 50 includes a land connection portion 52 that is joined to the connection land 34, and a bus bar connection portion 54 that is joined to the bus bar 21.

Land Connection Portion 52

As shown in FIGS. 2 to 6, the land connection portion 52 is formed in the shape of a square frame in a plan view at an outer peripheral edge portion of the connection piece 50. The land connection portion 52 is formed to have a size slightly smaller than that of the connection land 34. Accordingly, when the connection piece 50 is disposed below the land connection portion 52, the land connection portion 52 is disposed slightly inward of the connection land 34, as shown in FIGS. 4 and 5. The land connection portion 52 is joined to the connection land 34 using solder. In a state in which the land connection portion 52 and the connection land 34 are joined using solder, a fillet-shaped solder fillet S is formed between an outer peripheral edge of the land connection portion 52 and the connection land 34. That is, the connection land 34 and the land connection portion 52 are joined together and electrically connected using the solder fillet S. Here, "joined using solder" refers to one means of brazing and soldering, by which the land connection portion 52 and the connection land 34 (two base metals) are integrated with each other so as to be continuous, using melted solder, without melting the base metals such as the land connection portion 52 and the connection land 34.

Bus Bar Connection Portion 54

As shown in FIGS. 2 and 3, the bus bar connection portion 54 is formed in a square shape at the center of the connection piece 50. The bus bar connection portion 54 is formed to have the same size as that of the base material through hole 48 and the land through hole 35 of the sub-substrate 30B. Accordingly, in a state in which the connection piece 50 is disposed on the bus bar 21 and is disposed below the land connection portion 52, the bus bar connection portion 54 is exposed upward through the base material through hole 48 and the land through hole 35, while being disposed on the bus bar 21. The bus bar connection portion 54 is laser welded circularly to the bus bar 21 by emitting laser light from above through the base material through hole 48 and the land through hole 35. That is, the bus bar connection portion 54 and the bus bar 21 are joined together circularly, and are electrically connected. Consequently, a circular welding mark M is formed on the bus bar 21. In the portion in which the welding mark M is formed (the portion joined through laser welding), the bus bar connection portion 54, which is at least one of the base metals, i.e., the bus bar connection portion 54 and the bus bar 21, is melted, and the bus bar connection portion 54 and the bus bar 21 are alloyed and integrated with each other so as to be continuous. Note that in the cross-sectional view, the illustration of the portion joined through laser welding is omitted.

Insulating Protector 60

The insulating protector 60 is attached to the electricity storage element group 70 in a state in which the insulating protector 60 holds the bus bar 21 and the FPC 30 connected by the connection piece 50. The insulating protector 60 is made of an insulating synthetic resin. As shown in FIGS. 2 and 3, the insulating protector 60 includes a wire holding portion 62 and a plurality of extension portions 64.

The wire holding portion 62 is formed extending in a plate shape over the entire length of the electricity storage element group 70 in the front-rear direction so as to extend along the arrangement direction of the electricity storage elements 71. The width in the left-right direction of the wire holding portion 62 is formed to be larger than that of the main substrate 30A of the FPC 30. Accordingly, the wire holding portion 62 can hold the main substrate 30A of the FPC 30 from below. The width of the wire holding portion 62 is formed to be smaller than the length between the pair of electrode terminals 73 of the electricity storage element 71. The wire holding portion 62 is configured to be disposed between the pair of electrode terminals 73 on the upper surface of the electricity storage element 71 when attaching the insulating protector 60 to the electricity storage element group 70.

The plurality of extension portions 64 are formed extending in a prismatic shape in the left-right direction in a state in which the extension portions 64 are spaced apart in the front-rear direction at opposite side edge portions of the wire holding portion 62 in the left-right direction. The spacing between the extension portions 64 arranged side by side in the front-rear direction is set to be substantially the same as the thickness of the electricity storage elements 71 of the electricity storage element group 70. Accordingly, in a state in which the insulating protector 60 is attached to the electricity storage element group 70, each of the extension portions 64 is disposed above a boundary portion between the electricity storage elements 71 that are adjacent to each other in the front-rear direction.

Of the extension portions 64 arranged side by side in the front-rear direction, alternately-disposed extension portions 64 can each support a bus bar 21 from below.

Accordingly, the insulating protector 60 is configured to be attached to the electricity storage element group 70 in a state in which the insulating protector 60 holds the FPC 30 with the wire holding portion 62, and a plurality of bus bars 21 are held by the corresponding extension portions 64.

The configuration of the present embodiment is as described above. Next, an example of the assembly procedure of the wiring module 20 will be described, followed by a description of an example of the assembly procedure of the electricity storage module 10.

Assembly Procedure of Wiring Module 20

Prior to assembly of the wiring module 20, the connection piece 50 is joined to the FPC 30. As shown in FIG. 6, on the FPC 30 before the connection piece 50 is joined thereto, the sub-substrate 30B is disposed in the cut-out portion 43 of the main substrate 30A.

Therefore, as shown in FIG. 6, on the main substrate 30A, a cut is made in the main film portion 41 so as to conform to the shape of the cut-out portion 43, and the base material through hole 48 and the land through hole 35 are formed extending through the bus bar placement portion 47. In addition, on the bus bar placement portion 47, the connection land 34 is formed by removing a part of the sub-film portion 46 that is located above the portion that is to be formed as the connection land 34. On the main substrate 30A, parts of the main film portion 41 on the first conductive path 32 that are located at installation locations P of the electronic components E are removed.

Next, cream solder is applied to the connection land 34 and the installation locations P of the electronic components E, the connection piece 50 is placed on the connection land 34, and the electronic components E are placed on the respective corresponding installation locations P. Then, as a result of the FPC 30 being passed through a reflow furnace, the cream solder is melted, and thus the connection piece 50 and the connection land 34 are joined using the solder, and the first conductive paths 32 and the electronic components E are joined using the solder. Consequently, as shown in FIG. 7, the sub-substrate 30B and the connection piece 50 are electrically connected, and the main substrate 30A and the electronic components E are electrically connected.

In general, the surface of aluminum is susceptible to formation of an oxide film. Therefore, when members containing aluminum are joined using solder, operations for performing a treatment to prevent formation of an oxide film, and removing the oxide film are required.

However, the connection land 34 and the connection piece 50 are made of a metal containing copper or nickel, which is less susceptible to formation of an oxide film than aluminum is.

That is, since the surfaces of the connection land 34 and the land connection portion 52 are less susceptible to formation of an oxide film than the surface of aluminum is, the joining strength of solder joining between the connection land 34 and the land connection portion 52 can be improved as compared with, for example, the case where members containing aluminum are joined using solder.

Next, a portion of the main substrate 30A that borders the sub-substrate 30B is bent through valley folding, whereby the bent portion 42 is formed. As a result of the formation of the bent portion 42, the sub-substrate 30B disposed in the cut-out portion 43 is vertically inverted, and is disposed protruding leftward from the main substrate 30A, as shown in FIGS. 2 and 3.

Accordingly, as a result of the formation of the bent portion 42 of the FPC 30, the connection land 34 and the connection piece 50 are vertically inverted, whereby the sub-substrate 30B is formed.

That is, in the present embodiment, as shown in FIG. 6, the sub-substrate 30B is initially disposed in the cut-out portion 43 of the main substrate 30A, and the bent portion 42 is formed by making a cut in a part of the main film portion 41, whereby the sub-film portion 46 is formed. Accordingly, it is possible to improve the yield of the FPC 30 as compared with the case of forming an FPC in which the sub-base material originally protrudes from the main base material.

As shown in FIG. 7, before forming the bent portion 42, the connection piece 50 and the electronic components E can be collectively connected to the FPC 30 by passing the FPC 30 through a reflow furnace, with the connection piece 50 disposed on the connection land 34, and the electronic components E disposed on the first conductive paths 32. Accordingly, it is possible to reduce the number of man-hours and the manufacturing time as compared with the case where solder joining is performed on both surfaces of the FPC 30.

In the above-described manner, the FPC 30 to which the connection piece 50 is joined is completed.

Next, the FPC 30 to which the connection piece 50 is joined and the bus bar 21 are placed on the insulating protector 60, and the connection piece 50 and the bus bar 21 are joined.

Specifically, first, a plurality of bus bars 21 are disposed on the corresponding extension portions 64 of the insulating protector 60. Next, the main substrate 30A is placed on the wire holding portion 62 of the insulating protector 60, and is bonded and fixed onto the wire holding portion 62 using an adhesive or the like. Then, the connection piece 50 that has been joined to the sub-substrate 30B is placed on the bus bar 21.

Here, as shown in FIG. 4, the height position of the bus bar 21 and the height position of the main substrate 30A are misaligned in the up-down direction. However, the sub-film portion 46 of the sub-substrate 30B has flexibility. Therefore, when the connection piece 50 that has been joined to the sub-substrate 30B is placed on the bus bar 21, the positional misalignment in the up-down direction between the bus bar 21 and the main substrate 30A can be absorbed (adjusted) by the sub-substrate 30B as a result of the sub-substrate 30B undergoing flexural deformation. The positional misalignment in the up-down direction between the bus bar 21 and the main substrate 30A can also be absorbed (adjusted) by changing the bending angle of the bent portion 42.

Next, laser light is emitted to the bus bar connection portion 54 from above through the base material through hole 48 and the land through hole 35 on the bus bar placement portion 47, and the bus bar connection portion 54 and the bus bar 21 are joined through laser welding.

In general, when a member containing copper and a member containing aluminum are joined through laser welding, an intermetallic compound of copper and aluminum is produced in a joined portion where the two members are joined. When an intermetallic compound is produced in the joined portion, the joined portion becomes brittle, resulting in a reduction in the joining strength between the two members.

However, since the connection piece 50 is made of a metal containing nickel, which exhibits improved joining strength to aluminum relative to copper, the joining strength between the bus bar connection portion 54 and the bus bar 21 through laser welding can be improved as compared with the case where a member containing copper and a member containing aluminum are joined through laser welding.

In the manner described above, the connection piece 50 and the bus bar 21 are electrically connected, and thus the wiring module 20 is completed.

Assembly Procedure of Electricity Storage Module 10

To assemble the electricity storage module 10, the wiring module 20 is mounted to the electricity storage element group 70 so as to be placed from above.

The wiring module 20 is mounted by disposing the wire holding portion 62 of the insulating protector 60 between the pair of electrode terminals 73 of each electricity storage element 71, and disposing the bus bar 21 so as to extend over the corresponding adjacent electrode terminals 73.

Next, the bus bar 21 and the electrode terminals 73 are joined through laser welding by emitting laser light from above the bus bar 21. This completes the electricity storage module 10 to which the bus bar 21 and the electrode terminals 73 are electrically connected, as shown in FIGS. 2 and 3.

As described above, the connection structure between the FPC (flexible substrate) 30 and the bus bars 21 in the wiring module 20 and the electricity storage module 10 according to the present embodiment includes an FPC 30, at least one bus bar 21, and at least one connection piece 50, in which the FPC 30 is formed by a plurality of conductive paths 31 being covered by a flexible insulating film (resin base material) 40, the conductive paths 31 each containing copper (a first metal), the bus bar 21 contains aluminum (a second metal), which is different from copper, and is formed in a plate shape, the conductive paths 31 include a first conductive path 32, and a second conductive path 33 extending from the first conductive path 32, the insulating film 40 includes a band-shaped main film portion 41, and a sub-film portion 46 that is branched from the main film portion 41 and extends over the bus bar 21, at least one first conductive path 32 is disposed on the main film portion 41, at least one second conductive path 33 is disposed on the sub-film portion 46, the second conductive path 33 includes a connection land 34 exposed from the sub-film portion 46, the connection piece 50 contains nickel (a third metal) that is different from copper and aluminum, and that has a higher joining strength of welding to aluminum than a joining strength of welding between copper and aluminum, the connection piece 50 being formed in a plate shape, and the bus bar 21 is joined to the connection piece 50 through welding, and the connection land 34 is joined to the connection piece 50 using solder.

In general, copper or a copper alloy is used for conductive paths and bus bars of a flexible substrate such as a flexible printed circuit and a flexible flat cable. In recent years, aluminum or an aluminum alloy has been studied as a metal for conductive paths and bus bars of a flexible substrate such as a flexible printed circuit and a flexible flat cable.

Therefore, as a result of intensive studies, the present inventors have gained the knowledge that the joining strength between nickel and copper and the joining strength between nickel and aluminum are higher than the joining strength between copper and aluminum.

That is, according to the present embodiment, the connection land 34 exposed on the sub-film portion 46 of the FPC 30 extends over the bus bar 21. Also, the connection land 34 and the bus bar 21 are joined via the connection piece 50 made of a metal containing nickel, which has a high joining strength to copper and aluminum.

Therefore, according to the present embodiment, it is possible to electrically connect the FPC 30 and the bus bar 21, while improving the joining strength between the bus bar 21 and the connection piece 50.

Figure 15:
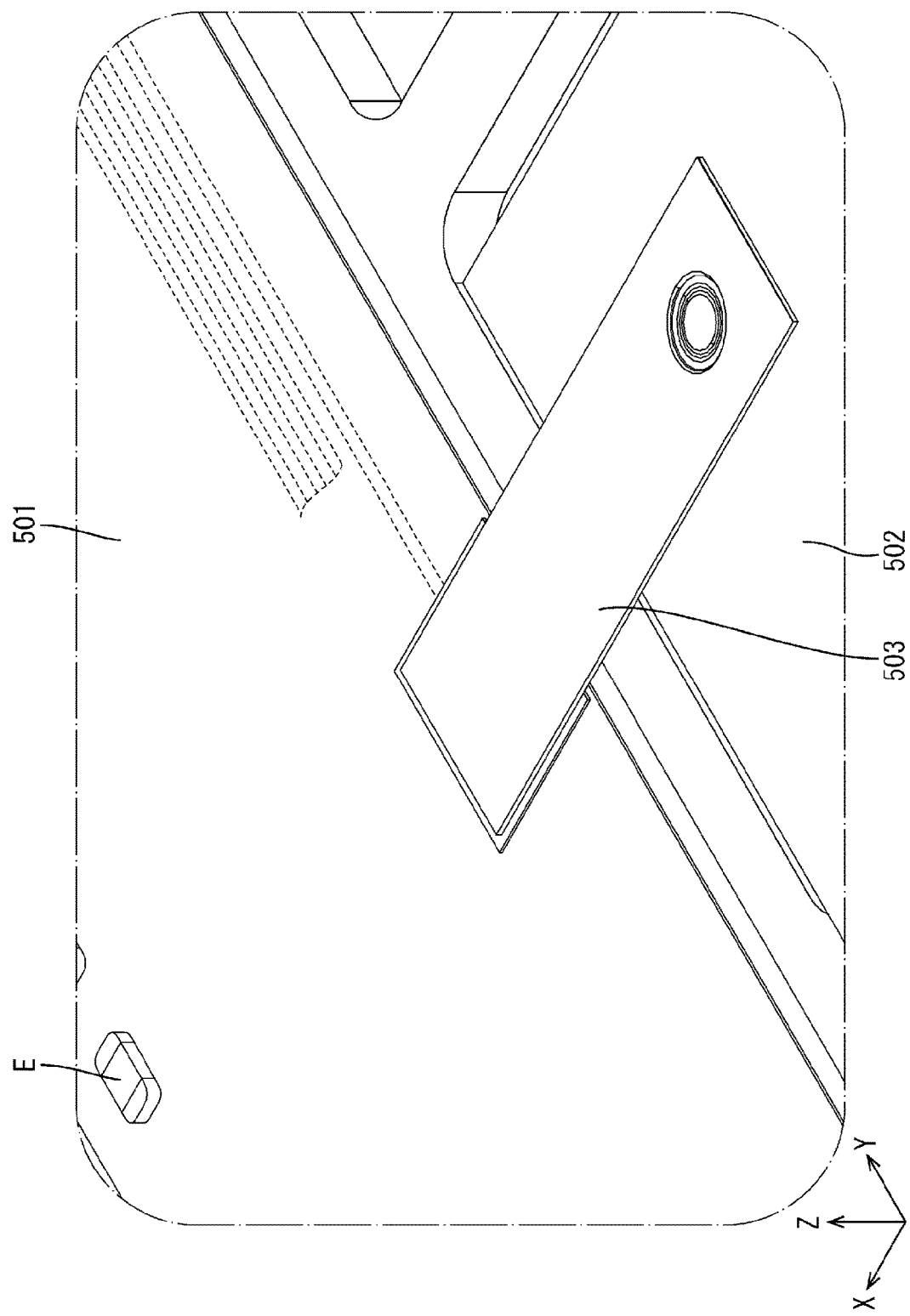
FIG. 15 is a partial perspective view of a wiring module in which an FPC and a bus bar are connected by a relay member bridging therebetween.

Also, in the case where the FPC 30 and the bus bar 21 have different thicknesses, the second conductive path 33 can be routed between the FPC 30 and the bus bar 21 as a result of the sub-film portion 46 being flexed. This makes it possible to connect the connection land 34 and the bus bar 21 without the need to align the FPC 30 with the bus bar 21 in advance. That is, unlike the case where an FPC 501 and a bus bar 502 are connected by a relay member 503 bridging between the FPC 501 and the bus bar 502, as shown in FIG. 15, for example, the connection piece 50 will not be inclined between the connection land 34 and the bus bar 21. Accordingly, it is possible to prevent a reduction in the joining strength between the connection piece 50, and the connection land 34 and the bus bar 21.

Since the connection land 34 disposed on the bus bar 21 and the bus bar 21 are connected via the connection piece 50, the size of the connection piece 50 can be reduced as compared with the case where the relay member 503 bridges between the FPC 501 and the bus bar 502 as shown in FIG. 15, for example. This makes it possible to reduce the manufacturing costs of the wiring module 20 and the electricity storage module 10.

The connection piece 50 of the present embodiment includes a land connection portion 52 and a bus bar connection portion 54, nickel is a metal whose surface is less susceptible to formation of an oxide film than a surface of aluminum is, the land connection portion 52 is joined to the connection land 34 using solder, and the bus bar connection portion 54 is joined to the bus bar 21 through welding.

For example, by forming the connection piece using the same metal as that of the bus bar in order to increase the joining strength to the bus bar, it is possible to increase the joining strength of welding between the bus bar and the bus bar connection portion. However, when the surface of the connection piece is susceptible to formation of an oxide film, although joining through welding can break down the oxide film, the joining strength between the land connection portion and the connection land is reduced unless the oxide film is removed, in the case of performing joining using solder.

However, since the connection piece 50 is formed so as to contain nickel, which is less susceptible to formation of an oxide film than the bus bar 21 is, the joining strength of joining using solder between the land connection portion 52 and the connection land 34 can be increased without the need to perform a treatment to remove the oxide film.

According to the present embodiment, the land connection portion 52 of the connection piece 50 is joined in advance to the connection land 34 of the FPC 30 using solder, and thereafter the bus bar connection portion 54 and the bus bar 21 are joined through welding. That is, it is possible to separately perform joining of the connection piece 50 and the connection land 34, and joining of the connection piece 50 and the bus bar 21, without the need to align the two members with the connection piece 50. Accordingly, as compared with, for example, the case where the connection piece 50 is joined to the two members at the same time, positional misalignment of the connection piece 50 relative to the connection land 34 and the bus bar 21 can be suppressed, thus making it possible to suppress a reduction in the joining strength of the joined portion due to positional misalignment.

The connection land 34 of the present embodiment is formed so as to be exposed on a surface of the sub-film portion 46 on the lower side (the bus bar 21 side), the land connection portion 52 is disposed between the connection land 34 and the bus bar 21, and the bus bar connection portion 54 is disposed so as to be exposed from the sub-film portion 46.

Further, the sub-film portion 46 includes the base material through hole 48 extending therethrough in the plate thickness direction, the connection land 34 includes the land through hole 35 that extends therethrough in the plate thickness direction and that is disposed coaxially with the base material through hole 48, and the bus bar connection portion 54 is exposed through the base material through hole 48 and the land through hole 35.

That is, the bus bar connection portion 54 can be laser welded to the bus bar 21, using, as a marker, the portion exposed from the sub-film portion 46 through the base material through hole 48 and the land through hole 35. Accordingly, it is possible to suppress positional misalignment of the portion welded through laser welding, thus making it possible to suppress a reduction in the joining strength between the bus bar connection portion 54 and the bus bar 21 due to positional misalignment of the welded portion.

Incidentally, for example, when the connection land is formed so as to be exposed on a surface of the sub-base material that is opposite to the bus bar side, the position of the connection land and the position of the bus bar are misaligned in the up-down direction (the thickness direction of the FPC). In such a case, it is necessary to machine the connection piece in order to align the land connection portion with the bus bar connection portion.

However, in the present embodiment, the position of the land connection portion 52 and the position of the bus bar connection portion 54 are not misaligned in the up-down direction, and it is therefore possible to electrically connect the FPC 30 and the bus bar 21 without machining the connection piece 50.

In the present embodiment, the main film portion 41 includes a bent portion 42 that is bent toward the sub-film portion 46, and that is continuous with the sub-film portion 46.

With this configuration, the sub-film portion 46 can be formed by making a cut in a part of the main film portion 41 to form the bent portion 42. Accordingly, it is possible to improve the yield of the FPC 30 as compared with, for example, the case of forming an FPC in which the sub-base material originally protrudes from the main base material.

An electronic component E that is connected to the first conductive path 32 using solder is attached on a surface of the main film portion 41 that is on the upper side (side opposite to the bus bar 21 side), and the bent portion 42 is bent so as to invert the connection land 34.

In the case of forming the bent portion 42 by inverting the connection land 34, the connection land 34 is exposed on the upper side where the electronic component E is disposed, in the state before the bent portion 42 is formed. Accordingly, before forming the bent portion 42, the connection piece 50 and the electronic component E are collectively connected to the FPC 30 by passing the FPC 30 through a reflow furnace, with the connection piece 50 disposed on the connection land 34, and the electronic component E disposed on the first conductive path 32. Then, the connection piece 50 is disposed between the connection land 34 and the bus bar 21 by forming the bent portion 42.

That is, for example, it is possible to connect the connection piece 50 and the electronic component E to the FPC 30 without the need to separately connect the connection piece and the electronic component to the FPC using solder. Accordingly, it is possible to reduce the number of man-hours. This can reduce the manufacturing costs of the wiring module 20, and hence the manufacturing costs of the electricity storage module 10.

The wiring module 20 according to the present embodiment is a vehicle wiring module 20 that is to be used while mounted in the vehicle 1.

Embodiment 2

Figure 8:
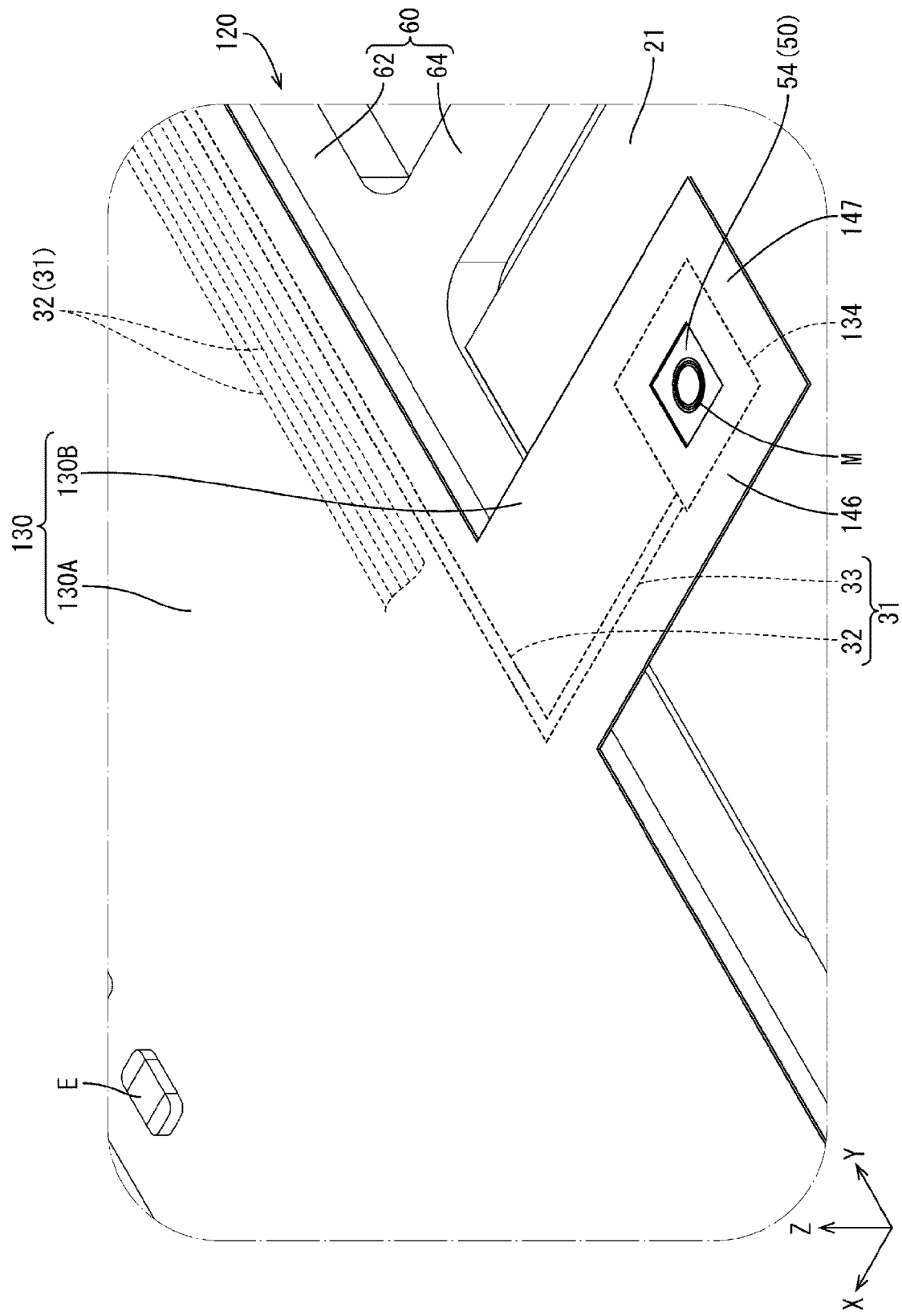
FIG. 8 is a partial perspective view of a wiring module according to Embodiment 2.

Next, Embodiment 2 will be described with reference to FIG. 8.

A wiring module 120 according to Embodiment 2 is formed by changing the shape of the FPC 30 according to Embodiment 1. The description of the components, functions, and effects that are held in common with Embodiment 1 is redundant and therefore has been omitted. In addition, components that are the same as those of Embodiment 1 are denoted by the same reference numerals.

In an FPC 130 according to Embodiment 2, a sub-substrate 130B is directly formed at a side edge of a main substrate 130A. Accordingly, the sub-substrate 130B of the present embodiment is formed extending leftward toward the bus bar 21 from the side edge of the main substrate 130A, without the bent portion 42 being formed as in Embodiment 1. A connection land 134 on a bus bar placement portion 147 is formed downward by removing a part of a sub-film portion 146 that is located below the connection land 134 of the bus bar placement portion 147. The connection piece 50 is joined to the downwardly exposed connection land 134 from below using solder.

That is, according to the present embodiment, the bus bar placement portion 147 of the sub-substrate 130B can be disposed on the bus bar 21, without performing an operation for bending a part of the FPC 130. Note that the sub-substrate 130B is configured to absorb the positional misalignment in the height direction (up-down direction) between the main substrate 130A and the bus bar 21 due to the sub-film portion 146 being flexed in the plate thickness direction (up-down direction).

Embodiment 3

Next Embodiment 3 will be described with reference to FIGS. 9 and 10.

A wiring module 220 according to Embodiment 3 is formed by changing the shape of the bus bar placement portion 147 and the configuration of the connection piece 50 of the FPC 130 according to Embodiment 2. The description of the components, functions, and effects that are held in common with Embodiments 1 and 2 is redundant and therefore has been omitted. In addition, components that are the same as those of Embodiments 1 and 2 are denoted by the same reference numerals.

Figure 9:
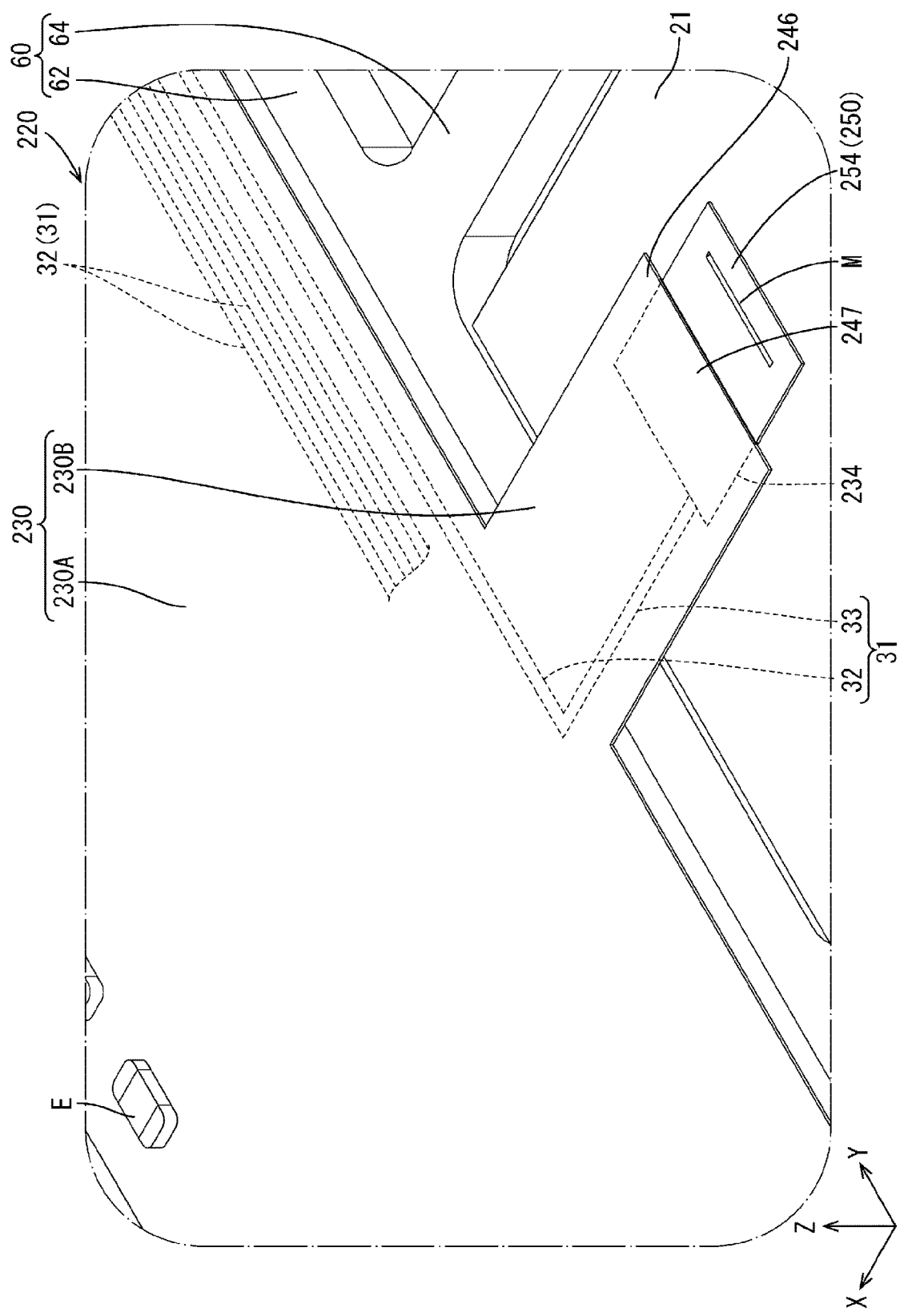
FIG. 9 is a partial perspective view of a wiring module according to Embodiment 3.
Figure 10:
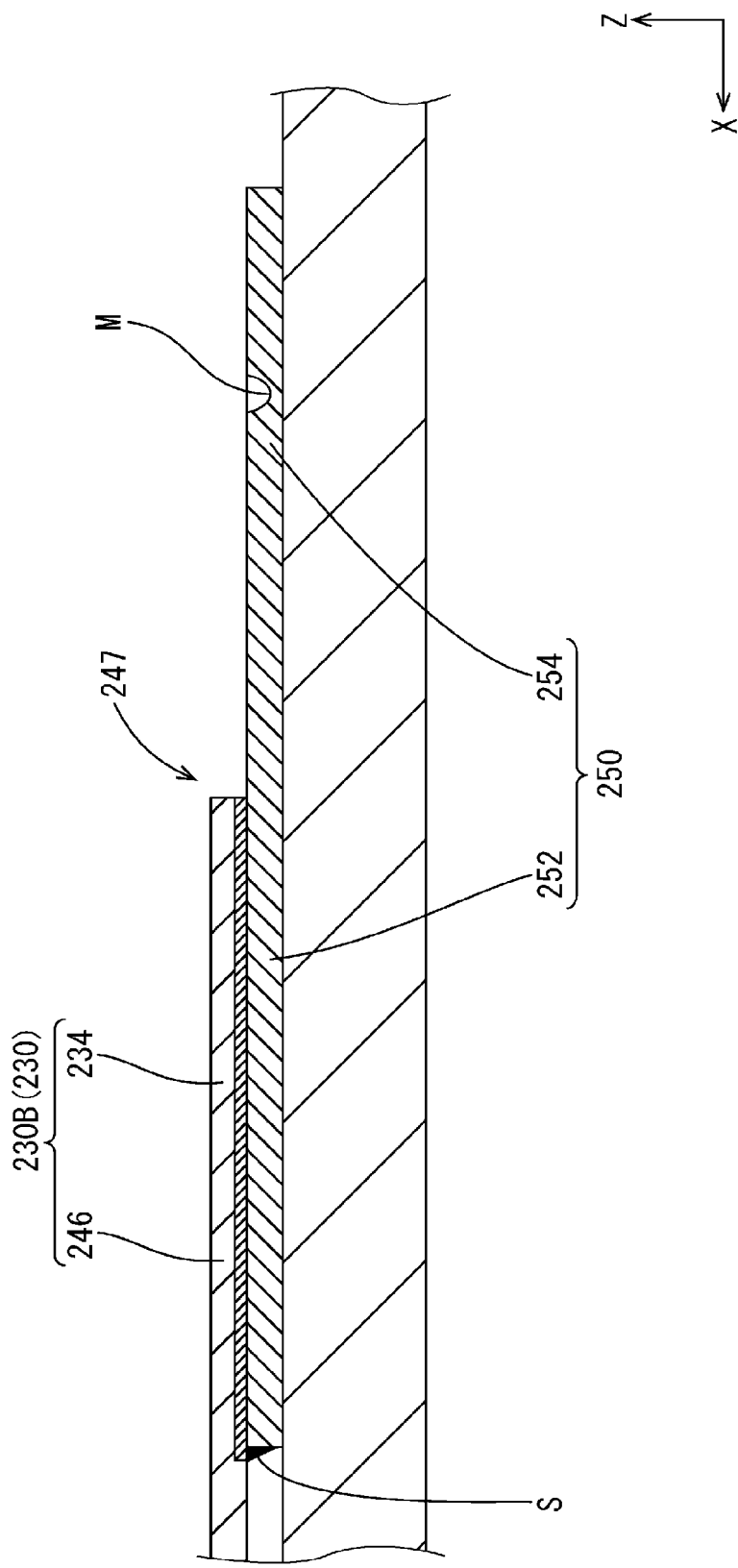
FIG. 10 is an enlarged cross-sectional view showing a principal part of FIG. 9, corresponding to the cross-section shown in FIG. 5.

As shown in FIGS. 9 and 10, a bus bar placement portion 247 of an FPC 230 according to Embodiment 3 is formed in a rectangular shape such that a connection land 234 is adjacent to a left edge of a bus bar placement portion 247.

On the other hand, a connection piece 250 is configured such that the right half of the connection piece 250 serves as a land connection portion 252 that is connected to the connection land 234, and the left half of the connection piece 250 serves as a bus bar connection portion 254 that is connected to the bus bar 21.

The land connection portion 252 is formed slightly smaller than the connection land 234.

Accordingly, when the land connection portion 252 and the connection land 234 are joined using solder, a fillet-shaped solder fillet S is formed between an outer peripheral edge of the land connection portion 152 and the connection land 234, as shown in FIG. 10. Consequently, the connection land 234 and the land connection portion 252 are joined together and electrically connected, using the solder fillet S.

When the connection land 234 and the land connection portion 252 are joined using solder, the bus bar connection portion (the left half of the connection piece 250) 254 is disposed on the bus bar 21 while protruding leftward from the bus bar placement portion 247 of the sub-substrate 230B, as shown in FIGS. 9 and 10.

In other words, a portion of the connection piece 250 that protrudes leftward from the bus bar placement portion 247 (the sub-film portion 246 of the sub-substrate 230A) serves as the bus bar connection portion 254.

The bus bar connection portion 254 is linearly joined to the bus bar 21 in the front-rear direction by being laser welded linearly in the front-rear direction from above while being disposed on the bus bar 21. Consequently, a linear welding mark M is formed on the bus bar 21.

That is, the bus bar connection portion 254 can be welded to the bus bar 21 by emitting a laser, using the portion exposed leftward from the bus bar placement portion 247 as a marker. This can suppress positional misalignment of the welded portion. Accordingly, it is possible to suppress a reduction in the joining strength between the bus bar connection portion 254 and the bus bar 21 due to positional misalignment of the welded portion location.

Embodiment 4

Next, Embodiment 4 will be described with reference to FIGS. 11 and 12.

A wiring module 320 according to Embodiment 4 is formed by changing the shape of the FPC 130 and the configuration of the connection piece 50 of Embodiment 2. The description of the components, functions, and effects that are held in common with Embodiments 1 and 2 is redundant and therefore has been omitted. In addition, components that are the same as those of Embodiments 1 and 2 are denoted by the same reference numerals.

Figure 11:
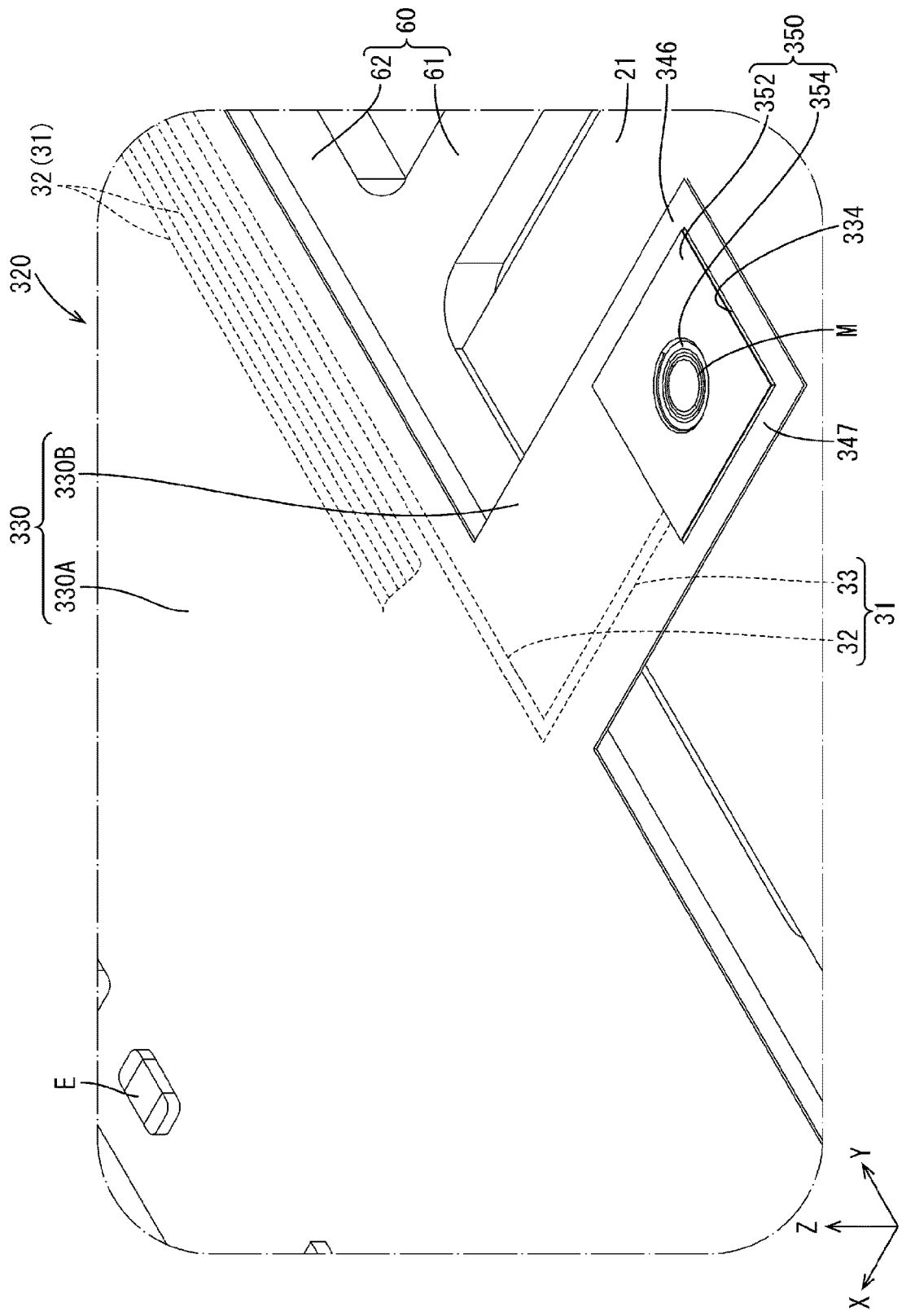
FIG. 11 is a partial perspective view of a wiring module according to Embodiment 4.
Figure 12:
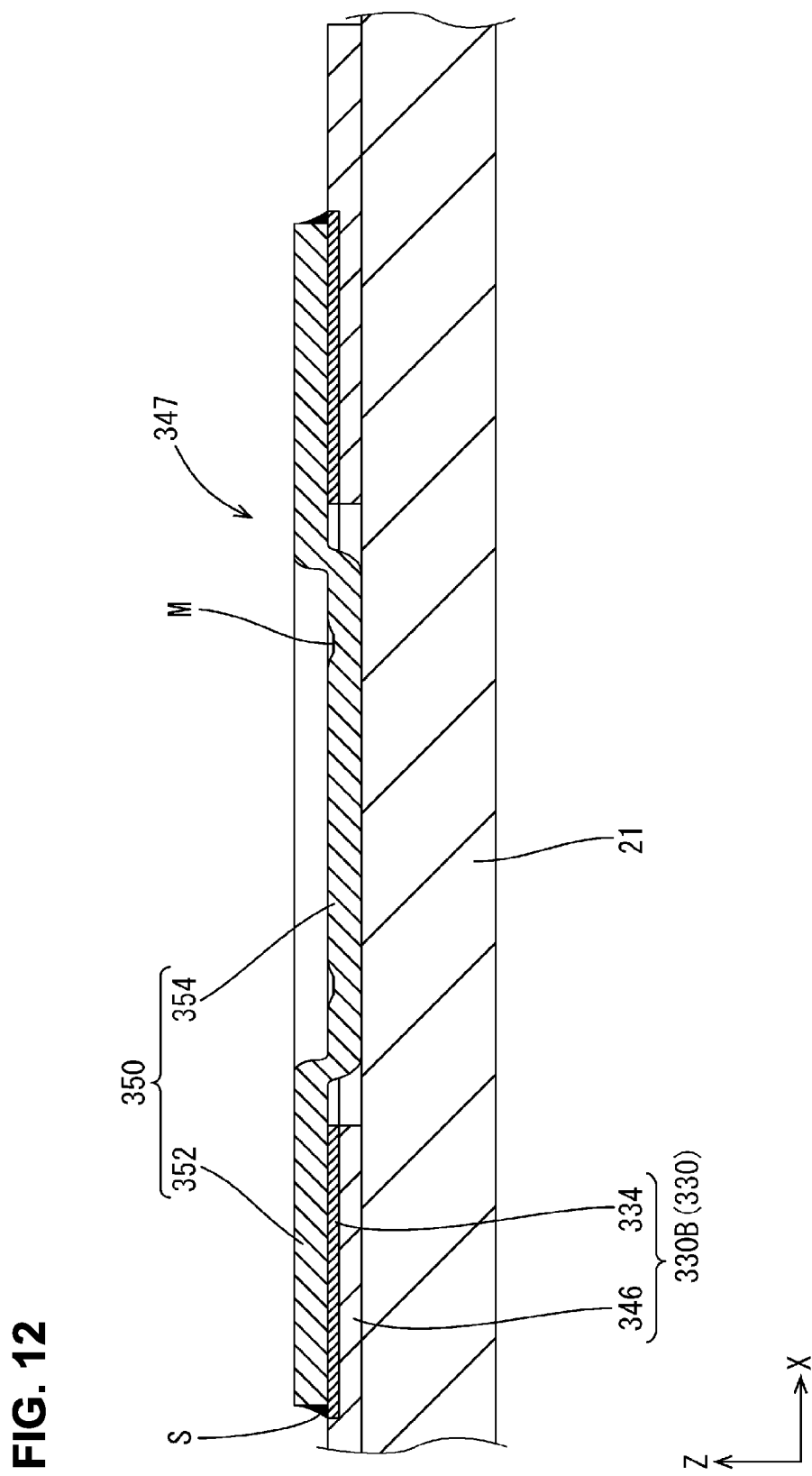
FIG. 12 is an enlarged cross-sectional view showing a principal part of FIG. 11, corresponding to the cross section shown in FIG. 5.

As shown in FIGS. 11 and 12, a connection land 334 of a bus bar placement portion 347 of an FPC 330 according to Embodiment 4 is formed upward by removing a part of the sub-film portion 346 that is located above the connection land 334.

On the other hand, a land connection portion 352 of a connection piece 350 is formed in the shape of a square frame in a plan view at an outer peripheral edge portion of the connection piece 350. The land connection portion 352 is formed to have a size slightly smaller than that of the connection land 334. Accordingly, when the land connection portion 352 and the connection land 334 are joined using solder, with the connection piece 350 disposed on the land connection portion 352, a fillet-shaped solder fillet S is formed between an outer peripheral edge of the land connection portion 352 and the connection land 334, as shown in FIG. 12. Consequently, the connection land 334 and the land connection portion 352 are joined together and electrically connected, using the solder fillet S.

As shown in FIGS. 11 and 12, a bus bar connection portion 354 of the connection piece 350 is formed in a circular shape at the center of the connection piece 350. The bus bar connection portion 354 is formed in a recessed shape having an upper surface recessed downward and a lower surface protruding downward. The protruding dimension by which the bus bar connection portion 354 protrudes downward from the land connection portion 352 is set to be greater than or equal to a total thickness of the connection land 334 and a sub-film portion 346 disposed below the connection land 334. Accordingly, when the bus bar connection portion 354 is disposed on the bus bar 21, the lower surface of the bus bar connection portion 354 is in surface contact with the bus bar 21, as shown in FIG. 12.

The bus bar connection portion 354 is laser welded circularly from above while being disposed on the bus bar 21, and is thus joined circularly to the bus bar 21. Consequently, a circular welding mark M is formed on the bus bar 21.

That is, according to the present embodiment, the connection piece 350 and the electronic component E can be collectively connected to the FPC 330 by passing the FPC 330 through a reflow furnace, with the connection piece 350 disposed on the connection land 334, and the electronic component E disposed on the first conductive path 32.

In addition, the bus bar connection portion 354 can be welded to the bus bar 21 by emitting laser light using the downwardly recessed portion of the connection piece 350 as a marker. This can suppress misalignment of the location to which laser light is emitted. Accordingly, it is possible to suppress a reduction in the joining strength between the bus bar connection portion 354 and the bus bar 21 due to positional misalignment of the welded portion.

Embodiment 5

Next, Embodiment 5 will be described with reference to FIGS. 13 and 14.

A wiring module 420 according to Embodiment 5 is formed by changing the shape of the FPC 330 and the configuration of the connection piece 350 of Embodiment 4. The description of the components, functions, and effects that are held in common with Embodiments 1, 2, and 4 is redundant and therefore has been omitted. In addition, components that are the same as those of Embodiments 1, 2, and 4 are denoted by the same reference numerals.

Figure 13:
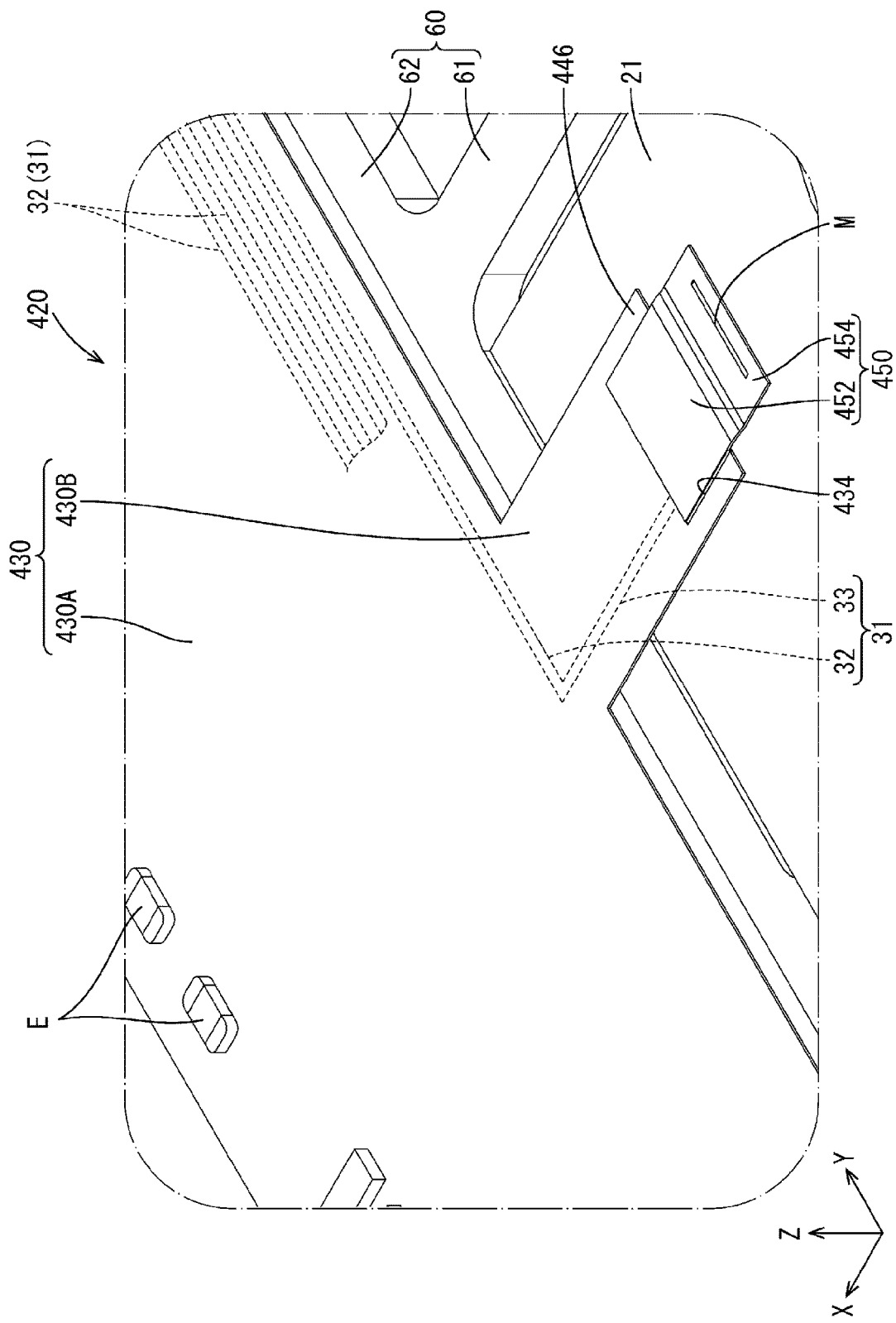
FIG. 13 is a partial perspective view of a wiring module according to Embodiment 5.
Figure 14:
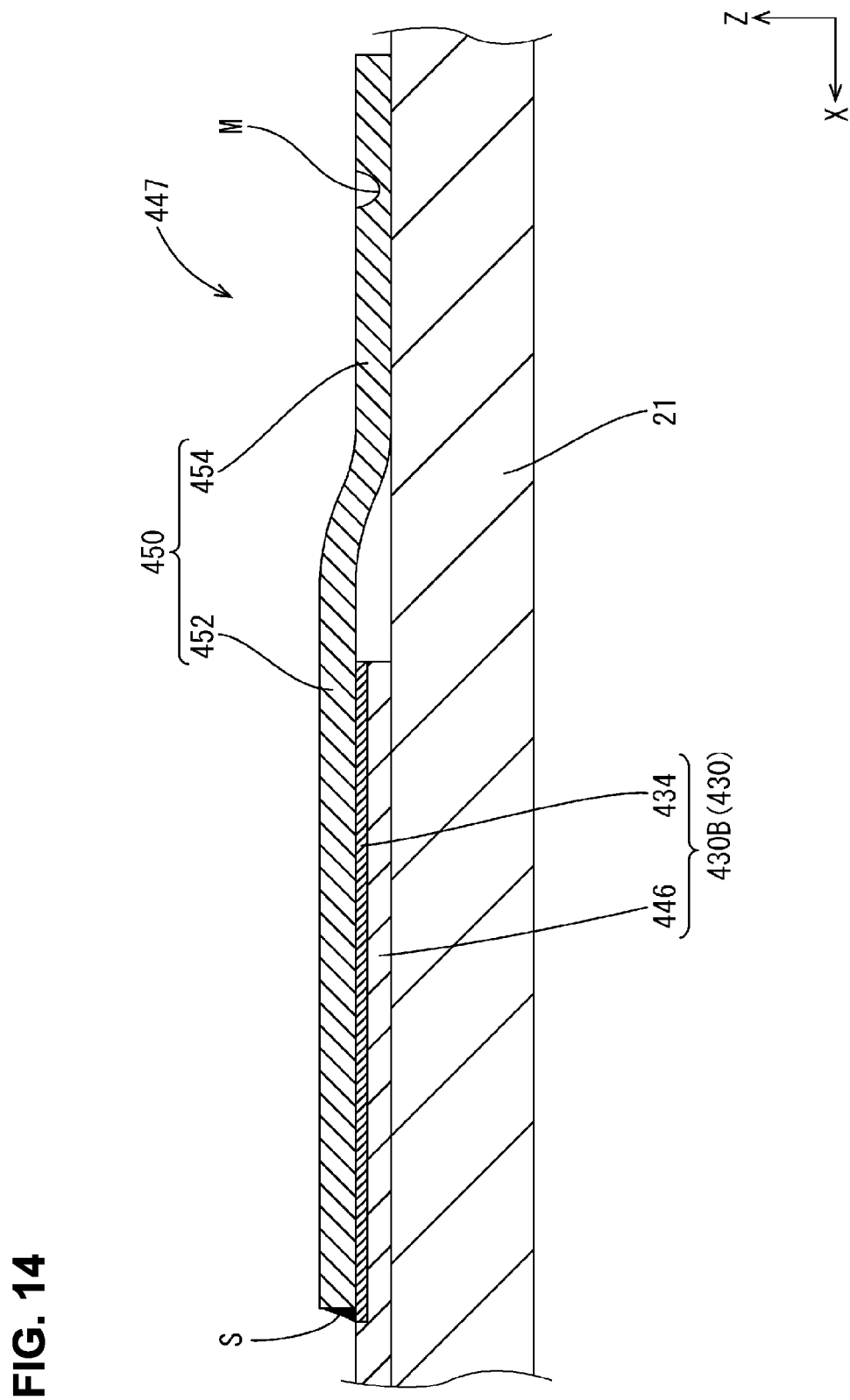
FIG. 14 is an enlarged cross-sectional view showing a principal part of FIG. 13, corresponding to the cross section shown in FIG. 5.

A bus bar placement portion 447 of an FPC 430 of Embodiment 5 is formed in a rectangular shape such that a connection land 434 is adjacent to a left edge of a bus bar placement portion 447, as shown in FIGS. 13 and 14.

On the other hand, a connection piece 450 is configured such that the right half of the connection piece 450 serves as a land connection portion 452 that is connected to the connection land 434, and the left half of the connection piece 450 serves as a bus bar connection portion 454 that is connected to the bus bar 21. The bus bar connection portion 454 is formed in a stepped shape having an upper surface recessed downward, and a lower surface protruding downward. The protruding dimension by which the bus bar connection portion 454 protrudes downward from the land connection portion 452 is set to be greater than or equal to a total thickness of the connection land 434 and a sub-film portion 446 disposed below the connection land 434.

Accordingly, a portion of the connection piece 450 that is located between the land connection portion 452 and the bus bar connection portion 454 is formed in a stepped shape such that the bus bar connection portion 454 is slightly stepped down relative to the land connection portion 452. Also, when the bus bar placement portion 447 is disposed on the bus bar 21, the lower surface of the bus bar connection portion 454 is in surface contact with the bus bar 21, as shown in FIG. 14.

The bus bar connection portion 454 is laser welded linearly in the front-rear direction from above while being disposed on the bus bar 21, and is thus joined linearly to the bus bar 21 in the front-rear direction. Consequently, a linear welding mark M is formed on the bus bar 21.

Thus, according to the present embodiment, the connection piece 450 and the electronic component E can be collectively connected to the FPC 430 by passing the FPC 430 through a reflow furnace, with the connection piece 450 disposed on the connection land 434, and the electronic component E disposed on the first conductive path 32.

Also, the bus bar connection portion 454 can be welded to the bus bar 21, using, as a marker, the portion of the connection piece 450 that is stepped downward. This can suppress misalignment of the location to which laser light is emitted. Accordingly, it is possible to suppress a reduction in the joining strength between the bus bar connection portion 454 and the bus bar 21 due to positional misalignment of the welded portion.

Other Embodiments

The technique disclosed in the present specification is not limited to the embodiments described and illustrated above, and includes, for example, the following various embodiments.

(1) In the above embodiments, the connection pieces 50, 150, 250, 350, and 450 are each formed by machining a nickel-containing metal plate material such as a nickel plate or a nickel alloy plate. However, the disclosed technique is not limited thereto, and the connection pieces may each be formed by a metal plate material obtained by plating a surface of aluminum, an aluminum alloy, copper, a copper alloy, iron, or the like with nickel.

(2) In Embodiments 1, 2, and 4 above, the base material through hole 48 and the land through hole 35 are formed in a square shape. However, the disclosed technique is not limited thereto, and the base material through hole and the land through hole may be formed in a circular shape, an oval shape, a polygonal shape, or the like.

(3) In the above embodiments, the insulating protector 60 holds one FPC 30,130, 230, 330, or 340. However, the disclosed technique is not limited thereto, and the insulating protector may hold a plurality of FPCs.

(4) In the above embodiments, the electronic components E are attached onto the FPCs 30, 130, 230, 330, and 430. However, the disclosed technique is not limited thereto, and it is possible to adopt a configuration in which no electronic component is attached onto the FPCs.

(5) In the above embodiments, two adjacent electrode terminals 73 are connected by the bus bar 21. However, the disclosed technique is not limited thereto, and three or more electrode terminals adjacent in the front-rear direction may be connected.

(6) In the above embodiments, a plurality of bus bars 21 and each of the FPCs 30, 130, 230, 330, or 340 are first disposed on the insulating protector 60, and each of the wiring modules 20, 120, 220, 320, and 420 is formed by welding the connection piece 50 to the bus bars 21. Thereafter, each of the wiring modules 20, 120, 220, 320, and 420 is mounted to the electricity storage element group 70, and the bus bars 21 are welded to the electrode terminals 73. However, the disclosed technique is not limited thereto, and the welding of the connection piece to the bus bars and the welding of the bus bars to the electrode terminals may be performed at the same time, with the insulating protector disposed on the electricity storage element group and the bus bars and each of the FPCs disposed on the electricity storage element group.

(7) In the above embodiments, the conductive path 31 of each of the FPCs 30, 130, 230, 330, and 340 is made of a copper-containing metal foil such as a copper foil or a copper alloy foil, and the bus bar 21 is formed by machining an aluminum-containing metal plate material such as an aluminum plate or an aluminum alloy plate. However, the disclosed technique is not limited thereto, and the conductive path may be made of an aluminum-containing metal foil such as an aluminum foil or an aluminum alloy foil, and the bus bar may be formed by machining a copper-containing metal plate material such as a copper plate or a copper alloy plate.

LIST OF REFERENCE NUMERALS

1 Vehicle
2 Electricity storage pack
3 PCU
4 Wire harness
10 Electricity storage module
20, 120, 220, 320, 420 Wiring module
21 Bus bar
30, 130, 230, 330, 340 FPC
30A, 130A, 230A, 330A, 430A Main substrate
30B, 130B, 230B, 330B, 430B Sub-substrate
31 Conductive path
32 First conductive path
33 Second conductive path
34, 134, 234, 334, 434 Connection land
35 Land through hole
40 Insulating film
41 Main film portion 42 Bent portion
43 Cut-out portion
46, 146, 246, 346, 446 Sub-film portion
47, 147, 247, 347, 447 Bus bar placement portion
48 Base material through hole
50, 150, 250, 350, 450 Connection piece
52, 252, 352, 452 Land connection portion
54, 254, 354, 454 Bus bar connection portion
60 Insulating protector
62 Wire holding portion
64 Extension portion
70 Electricity storage element group
71 Electricity storage element
73 Electrode terminal
501 FPC
502 Bus bar
503 Relay member
E Electronic component
P Installation location
S Solder fillet

The invention claimed is:

1. A connection assembly, comprising:
a flexible substrate, at least one bus bar, and at least one connection piece provided between the flexible substrate and the at least one bus bar,
wherein the flexible substrate is formed by conductive paths covered by a flexible resin base material having an insulating property, each of the conductive paths containing a first metal,
each of the at least one bus bar contains a second metal different from the first metal and is formed in a plate shape,
each of the conductive paths include a first conductive path, and a second conductive path extending from the first conductive path,
the flexible resin base material includes a band-shaped main base material, and a sub-base material that is branched from the main base material and extends over each of the at least one bus bar,
at least one first conductive path from among the conductive paths is disposed on the main base material,
at least one second conductive path from among the conductive paths is disposed on the sub-base material,
each second conductive path from among the conductive paths includes a connection land exposed from the sub-base material,
each of the at least one connection piece contains a third metal that is different from the first metal and the second metal, and the third metal has a higher joining strength of welding to the second metal than a joining strength of welding between the first metal and the second metal, the at least one connection piece being formed in a plate shape, and
each of the at least one bus bar is joined to a respective connection piece from among each of the at least one connection piece through welding, and each connection land of each second conductive path is joined to the respective connection piece from among each of the at least one connection piece through brazing and soldering.

2. The connection assembly according to claim 1,
wherein each of the at least one connection piece includes a land connection portion and a bus bar connection portion,
the third metal is a metal whose surface is less susceptible to formation of an oxide film than a surface of the second metal is,
each land connection portion of each of the at least one connection piece is joined to a respective one of each connection land of each second conductive path through brazing and soldering, and
each bus bar connection portion of each of the at least one connection piece is joined to a respective one of the at least one bus bar through welding.

3. The connection assembly according to claim 2,
wherein the first metal is copper, the second metal is aluminum, and the third metal is nickel.

4. The connection assembly according to claim 2,
wherein the first metal is aluminum, the second metal is copper, and the third metal is nickel.

5. The connection assembly according to claim 2,
wherein each connection land of each second conductive path is formed so as to be exposed on a surface of the sub-base material that is on a bus bar side,
each land connection portion is disposed between the respective one of each connection land of each second conductive path and the respective one of the at least one bus bar, and
each bus bar connection portion of each of the at least one connection piece is disposed so as to be exposed from the sub-base material.

6. The connection assembly according to claim 5,
wherein the main base material includes a bent portion that is bent toward the sub-base material, and that is continuous with the sub-base material.

7. The connection assembly according to claim 6,
wherein an electronic component that is connected to the at least one first conductive path from among the conductive paths using solder is attached on a surface of the main base material that is opposite to the bus bar side, and
the bent portion is bent so as to invert each connection land of each second conductive path.

8. The connection assembly according to claim 2,
wherein each connection land of each second conductive path is formed so as to be exposed on a surface of the sub-base material that is on the bus bar side, and
a surface of each bus bar connection portion of each of the at least one connection piece that is opposite to the respective one of the at least one bus bar is recessed, and a surface of each bus bar connection portion of each of the at least one connection piece that is on the bus bar side protrudes toward the respective one of the at least one bus bar.

9. The connection assembly according to claim 3,
wherein the sub-base material has a base material through hole extending therethrough in a plate thickness direction,
wherein each connection land of each second conductive path has a land through hole extending therethrough in a plate thickness direction, the land through hole being disposed coaxially with the base material through hole, and
wherein each bus bar connection portion of each of the at least one connection piece is exposed through the base material through hole and the land through hole.

10. A wiring module comprising:
the connection assembly according to claim 1; and
an insulating protector that is attached to an electricity storage element group in which a plurality of electricity storage elements including electrode terminals are arranged side by side, in a state in which the insulating protector holds the flexible substrate and the at least one bus bar, wherein the at least one bus bar is provided as a plurality of bus bars, and wherein the plurality of bus bars are joined to the electrode terminals through welding.

11. The wiring module according to claim 10, wherein the wiring module is a vehicle wiring module that is to be used while mounted in a vehicle.

12. An electricity storage module comprising:

the wiring module according to claim 10; and the electricity storage element group.

* * * * *